United States Patent
Hayashi et al.

(10) Patent No.: US 8,164,116 B2
(45) Date of Patent: Apr. 24, 2012

(54) SEMICONDUCTOR DEVICE WITH HETERO SEMICONDUCTOR REGION AND METHOD OF MANUFACTURING THE SAME

(75) Inventors: Tetsuya Hayashi, Yokosuka (JP); Yoshio Shimoida, Yokosuka (JP); Masakatsu Hoshi, Yokohama (JP); Hideaki Tanaka, Yokohama (JP); Shigeharu Yamagami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 551 days.

(21) Appl. No.: 12/065,847

(22) PCT Filed: Aug. 22, 2006

(86) PCT No.: PCT/JP2006/316806
§ 371 (c)(1),
(2), (4) Date: Mar. 5, 2008

(87) PCT Pub. No.: WO2007/032197
PCT Pub. Date: Mar. 22, 2007

(65) Prior Publication Data
US 2009/0278169 A1    Nov. 12, 2009

(30) Foreign Application Priority Data

Sep. 12, 2005  (JP) ................. 2005-263313
Apr. 26, 2006  (JP) ................. 2006-122197
May 16, 2006  (JP) ................. 2006-136144

(51) Int. Cl.
*H01L 29/66*    (2006.01)

(52) U.S. Cl. ............. 257/194; 257/12; 257/20; 257/51; 257/183; 257/E29.246; 257/E21.395; 257/E21.399; 257/E21.403; 257/E21.407

(58) Field of Classification Search ............. 257/20, 257/183, 194, E29.246, E29.252, E29.253, 257/E21.395, E21.399, E21.403, E21.407, 257/12, 51
See application file for complete search history.

(56) References Cited

U.S. PATENT DOCUMENTS

| | | | |
|---|---|---|---|
| 4,952,526 | A | 8/1990 | Pribat et al. |
| 6,075,259 | A | 6/2000 | Baliga |
| 6,232,625 | B1 | 5/2001 | Bartsch et al. |

(Continued)

FOREIGN PATENT DOCUMENTS

EP    0 336 830 A1    10/1989

(Continued)

OTHER PUBLICATIONS

P. M. Shenoy et al., "High Voltage P+ polysilicon/N 6H—SiC heterojunction diodes," Electronics Letters, vol. 33, No. 12, Jun. 5, 1997, pp. 1086-1087.

*Primary Examiner* — A. Sefer
*Assistant Examiner* — Farid Khan
(74) *Attorney, Agent, or Firm* — Foley & Lardner LLP

(57) ABSTRACT

A semiconductor device includes: a semiconductor base; a hetero semiconductor region which is in contact with the semiconductor base and which has a band gap different from that of the semiconductor base; a first electrode connected to the hetero semiconductor region; and a second electrode forming an ohmic contact to the semiconductor base. The hetero semiconductor region includes a laminated hetero semiconductor region formed by laminating a plurality of semiconductor layers in which crystal alignment is discontinuous at a boundary between at least two layers.

15 Claims, 18 Drawing Sheets

U.S. PATENT DOCUMENTS

| | | |
|---|---|---|
| 2002/0149064 A1 | 10/2002 | Ballantine et al. |
| 2004/0031971 A1 | 2/2004 | Shimoida et al. |
| 2005/0045892 A1 * | 3/2005 | Hayashi et al. ............... 257/77 |

FOREIGN PATENT DOCUMENTS

| | | |
|---|---|---|
| EP | 0 651 447 A1 | 5/1995 |
| EP | 0 901 169 A1 | 3/1999 |
| EP | 1 047 135 A2 | 10/2000 |
| EP | 1 503 425 A2 | 2/2005 |
| JP | 2003-318413 A | 11/2003 |
| JP | 2005-259797 A | 9/2005 |
| WO | WO 98/59377 A1 | 12/1998 |
| WO | WO 03/023859 A1 | 3/2003 |

* cited by examiner

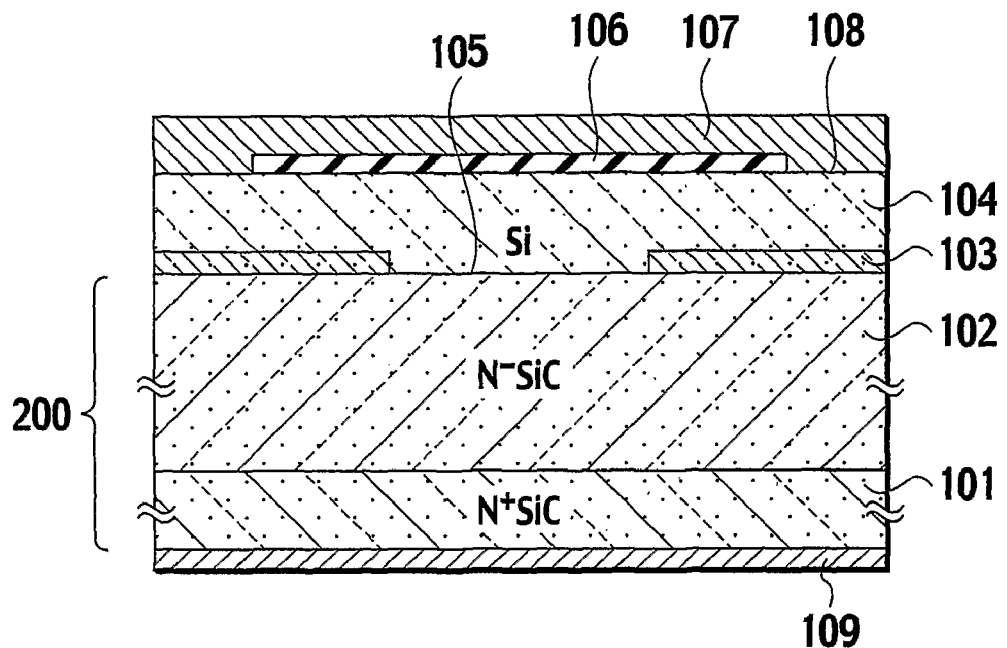
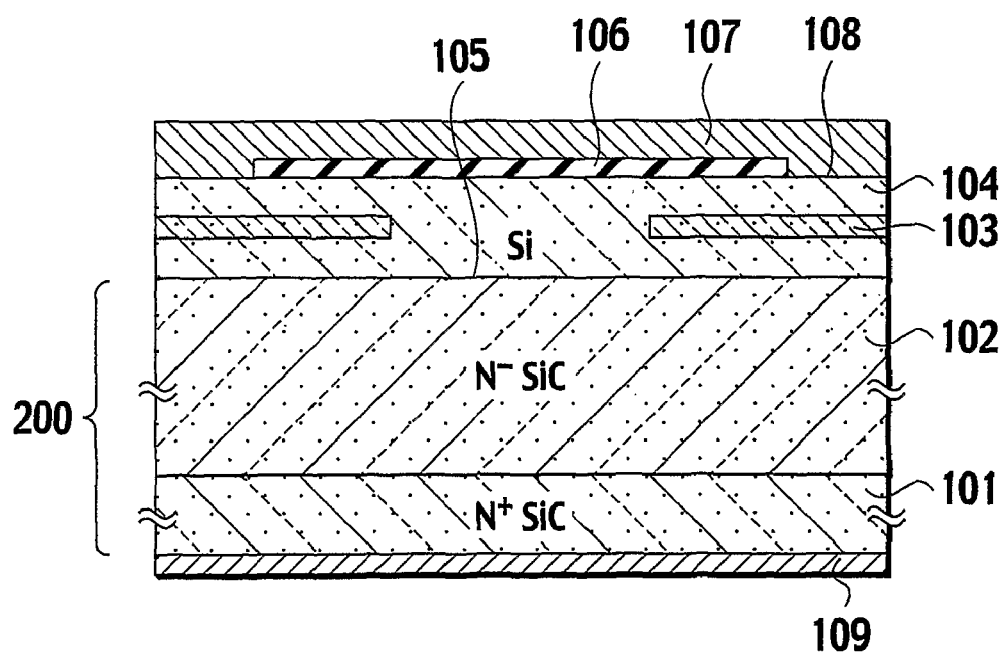

SEMICONDUCTOR DEVICE WITH HETERO SEMICONDUCTOR REGION AND METHOD OF MANUFACTURING THE SAME

BACKGROUND OF THE INVENTION

The present invention relates to a semiconductor device and a method of manufacturing the same. More specifically, the present invention relates to a technology for reducing leakage current during reverse operation and improving cutoff characteristics.

Heretofore, a semiconductor device has been known in which a P+ type polysilicon region is formed in contact with one main surface of a semiconductor base having an N− type epitaxial region formed on an N+ type silicon carbide substrate. In such a semiconductor device, a heterojunction is formed between the epitaxial region and the polysilicon region, a top metal electrode is formed on the polysilicon region, and a backside metal electrode is formed on the back surface of the silicon carbide substrate. By applying a voltage between the electrodes using the top metal electrode as an anode and the backside metal electrode as a cathode, rectifying behavior is caused to occur at the heterojunction interface. Thus, diode characteristics can be obtained.

Specifically, conduction characteristics corresponding to forward characteristics of a diode are obtained in the case where a positive potential is applied to the anode with the cathode being grounded, and, on the other hand, blocking characteristics corresponding to reverse characteristics of a diode are obtained in the case where a negative potential is applied to the anode. These forward and reverse characteristics show characteristics similar to those of a schottky barrier formed at a junction between a metal electrode and a semiconductor material, and can be arbitrarily adjusted. Accordingly, the semiconductor device has the advantage that it can be adjusted to an optimum breakdown voltage series as needed compared to a diode utilizing a schottky barrier. Moreover, adjusting the impurity density and the conductivity type of the polysilicon region to predetermined conditions makes it possible to obtain very small leakage current characteristics through an operation mechanism essentially different from that of a schottky barrier.

SUMMARY OF THE INVENTION

However, if a heterojunction is merely formed by using polysilicon, leakage current characteristics of reverse characteristics show a tendency similar to that of a schottky barrier diode, and high cutoff performance and temperature characteristics different from those of a schottky barrier cannot be brought out.

Since large leakage current is generated during reverse operation by the influence of grain boundaries existing in the polysilicon region, it is difficult to realize theoretical cutoff characteristics. In other words, due to the existence of grain boundaries, there have been limitations in improving leakage current characteristics during reverse operation.

The present invention has been accomplished in order to solve the above-described problems of prior arts. An object of the present invention is to provide a semiconductor device in which leakage current during reverse operation can be reduced, in which cutoff characteristics can be improved, and in which loss at the time of forward conduction can be reduced, and to provide a method of manufacturing the same.

In order to achieve the above-described object, according to the present invention, a semiconductor device, comprises: a semiconductor base of a first conductivity type; a hetero semiconductor region in contact with one main surface of the semiconductor base, the hetero semiconductor region having a band gap width different from that of the semiconductor base; a first electrode connected to the hetero semiconductor region; and a second electrode connected to the semiconductor base. The hetero semiconductor region comprises structure for cutting off leakage current generated during reverse operation.

BRIEF DESCRIPTION OF THE DRAWINGS

FIG. 19 is a cross-sectional view of a semiconductor device for explaining a sixth embodiment of the present invention;

FIG. 20 is a cross-sectional view of a semiconductor device for explaining other forms of the sixth embodiment of the present invention;

DETAILED DESCRIPTION OF THE PREFERRED EMBODIMENTS

An overview of features and effects of a semiconductor device according to the present invention is as follows.

In the case where an epitaxial region, which is an uppermost layer of a semiconductor base, is of N type, a lowest layer of a laminated hetero semiconductor region which is in contact with the epitaxial region is made to be of P+ type. By employing a constitution in which full depletion does not occur, leakage current is reduced. Furthermore, in order to utilize the feature of the epitaxial region that the proportion of occurrence of leakage current is small, the impurity concentration of the lowest layer of the laminated hetero semiconductor region is made to be a predetermined concentration.

Moreover, in embodiments below, while polysilicon including a large number of crystal grains is used, a heterojunction diode is formed using the laminated hetero semiconductor region. Accordingly, it is possible to reduce the supply of conduction electrons, which serve as majority carriers for the N type epitaxial region, from an anode electrode (first electrode) through grain boundaries of polysilicon. Furthermore, a structure is provided in which leakage current is less prone to occur.

By employing such a constitution, the supply of electrons from the lowest layer of the laminated hetero semiconductor region is significantly reduced in the case where a reverse bias is applied between the anode and the cathode of the heterojunction diode. Thus, leakage current is greatly reduced.

Hereinafter, details of the present invention will be described using the embodiments.

First Embodiment

Figure 1:
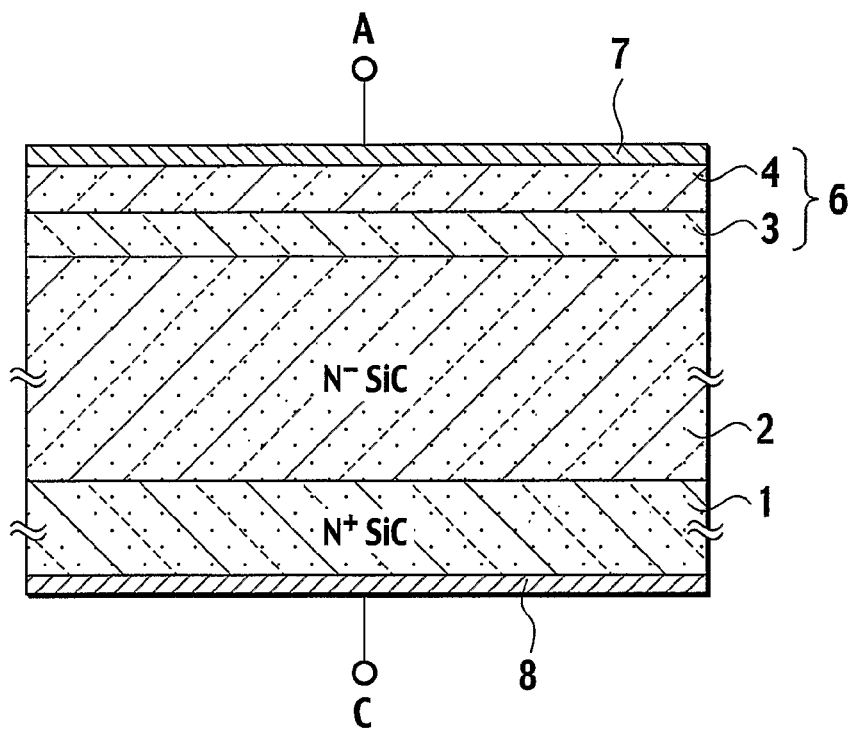
FIG. 1 is a cross-sectional view of a semiconductor device for explaining first and second embodiments of the present invention.

FIG. 1 shows a first embodiment of a semiconductor device according to the present invention. In this embodiment, a semiconductor device in which silicon carbide is used as a substrate material will be described as one example.

For example, an N− type epitaxial region 2 is formed on an N+ type substrate region 1 in which the polytype of silicon carbide is 4H type. An assembly of the substrate region 1 and the epitaxial region 2 is a semiconductor base of a first conductivity type. The first conductivity type in this case is N type.

As the substrate region 1, for example, one having a resistivity of several milliohm centimeters to several tens of milliohm centimeters and a thickness of approximately 50 to 400 μm can be used.

As the epitaxial region 2, for example, one can be used which has an N type impurity concentration of $10^{15}$ to $10^{18}$ cm$^{-3}$ and a thickness of several micrometers to several tens of micrometers. In this embodiment, a description will be given for the case where one having an impurity concentration of $10^{16}$ cm$^{-3}$ and a thickness of 10 μm is used.

It should be noted that in this embodiment, a description will be given using as one example a substrate in which the epitaxial region 2 is formed on the substrate region 1, but that a substrate which has an appropriate resistivity and which is formed only of the substrate region 1 may be used as the semiconductor base of the first conductivity type.

A lowest hetero semiconductor region 3, which is a lowest semiconductor layer, is deposited to be in contact with a main surface (one main surface of the semiconductor base of the first conductivity type) of the epitaxial region 2 which is opposite from the bonded surface thereof with the substrate region 1. In this embodiment, the case where the lowest hetero semiconductor region 3 is made of polysilicon having a band gap smaller than that of silicon carbide is shown as one example. The junction between the epitaxial region 2 and the lowest hetero semiconductor region 3 is a heterojunction between silicon carbide and polysilicon, which are materials having different band gaps. At the junction interface, an energy barrier exists.

Figure 2:
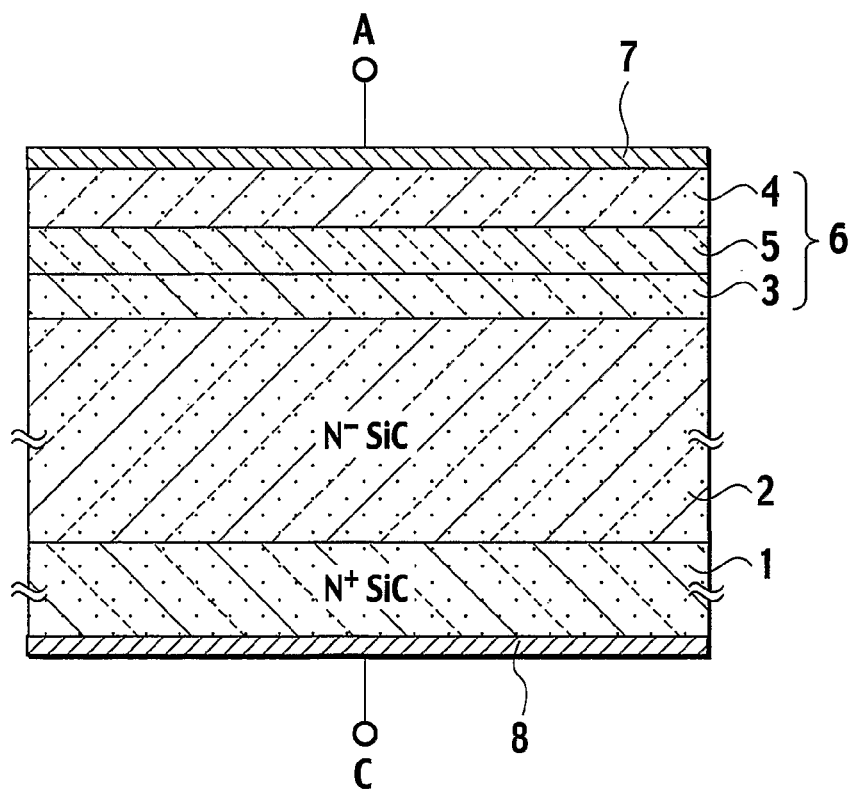
FIG. 2 is a cross-sectional view of a semiconductor device for explaining other forms of the first and second embodiments of the present invention.

Moreover, in this embodiment, an uppermost hetero semiconductor region 4 (uppermost polysilicon layer), which is made of polysilicon and which is an uppermost semiconductor layer, is formed to be superposed on the lowest hetero semiconductor region 3 (lowest polysilicon layer), which is the lowest semiconductor layer. Thus, in this embodiment, the lowest and uppermost hetero semiconductor regions 3 and 4, which are two semiconductor layers, the uppermost hetero semiconductor region 4 being superposed on the lowest hetero semiconductor region 3 to form a laminated hetero semiconductor region 6. This laminated hetero semiconductor region 6 plays the role of a hetero semiconductor region. For example, as shown in FIG. 2, one or a plurality of intermediate hetero semiconductor regions 5 (intermediate polysilicon layers), which are semiconductor layers, may be formed between the lowest and uppermost hetero semiconductor regions 3 and 4 to form the laminated hetero semiconductor region 6.

Since both the lowest and uppermost hetero semiconductor regions 3 and 4 are made of polysilicon, crystal alignment is discontinuous at the interface between these two layers. Also in embodiments below, such discontinuous crystal alignment is realized as long as at least one of hetero semiconductor region layers which are components of the laminated hetero semiconductor region 6 is a polycrystalline layer. Furthermore, in general, except for the case where all of hetero semiconductor region layers which are components of the laminated hetero semiconductor region 6 are epitaxially grown layers, such discontinuous crystal alignment is realized at the interface between two layers.

In the description of this embodiment, an impurity is introduced into the lowest and uppermost hetero semiconductor regions 3 and 4. Here, the lowest and uppermost hetero semiconductor regions 3 and 4 are heavily doped (impurity introduction) to be of P type (P+ type), which is a second conductivity type.

In this embodiment, a first electrode 7 is formed on the upper surface of the uppermost hetero semiconductor region 4, and a second electrode 8 is formed under the substrate region 1. The first electrode 7 forms an ohmic contact to the uppermost hetero semiconductor region 4, and the second electrode 8 forms an ohmic contact to the substrate region 1. For example, as metal materials, titanium (Ti) having aluminum (Al) deposited thereon or the like can be used as the first electrode 7, and titanium (Ti) having nickel (Ni) deposited thereon or the like can be used as the second electrode 8. Thus, in this embodiment, a description will be given for the case where a vertical diode having the first electrode 7 as an anode electrode and the second electrode 8 as a cathode electrode is constructed.

Figure 3:
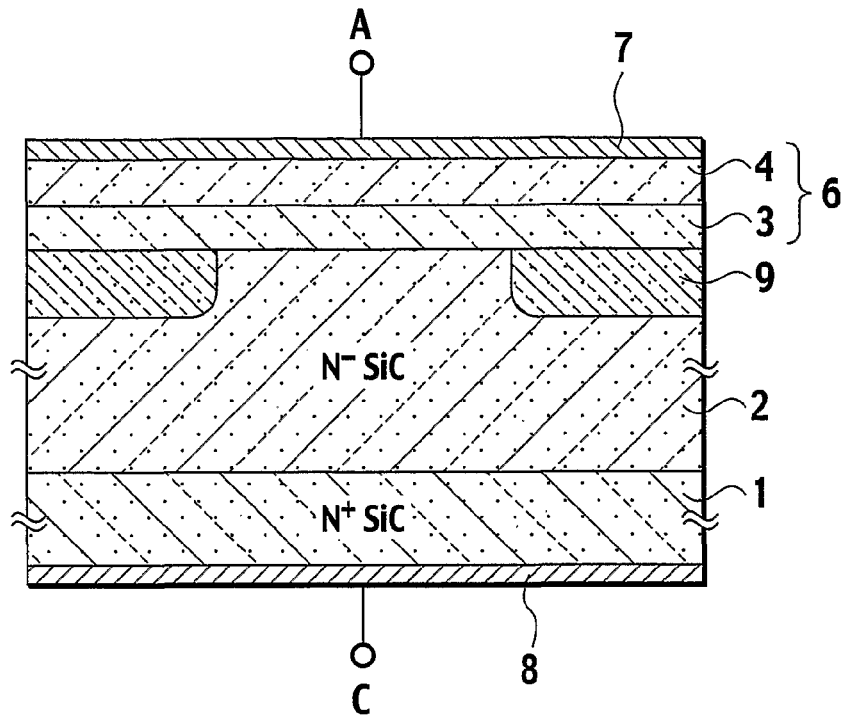
FIG. 3 is a cross-sectional view of a semiconductor device for explaining other forms of the first and second embodiments of the present invention.
Figure 4:
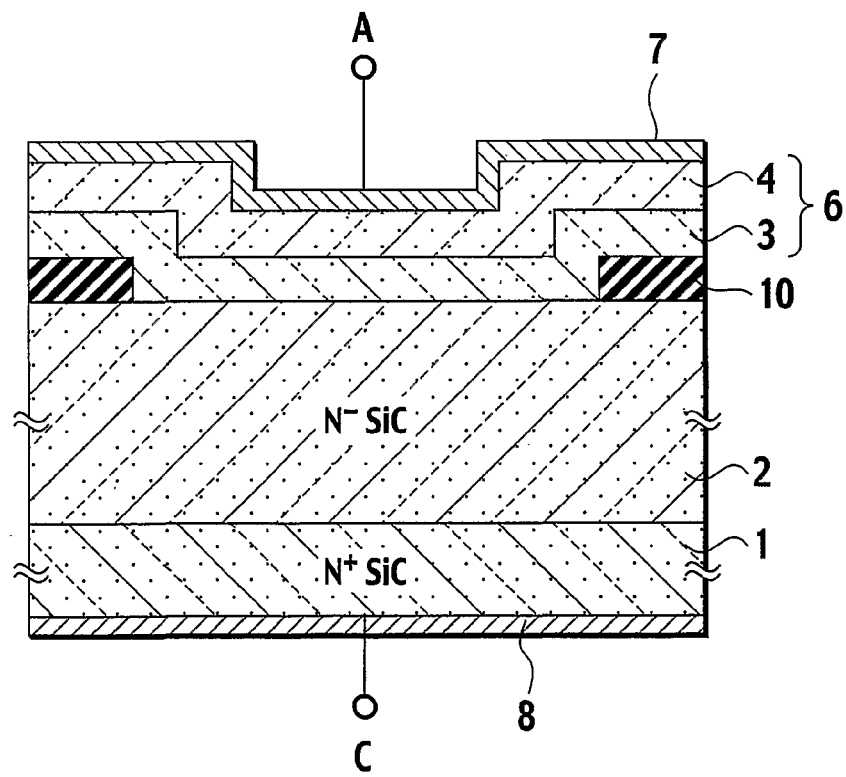
FIG. 4 is a cross-sectional view of a semiconductor device for explaining other forms of the first and second embodiments of the present invention.
Figure 5:
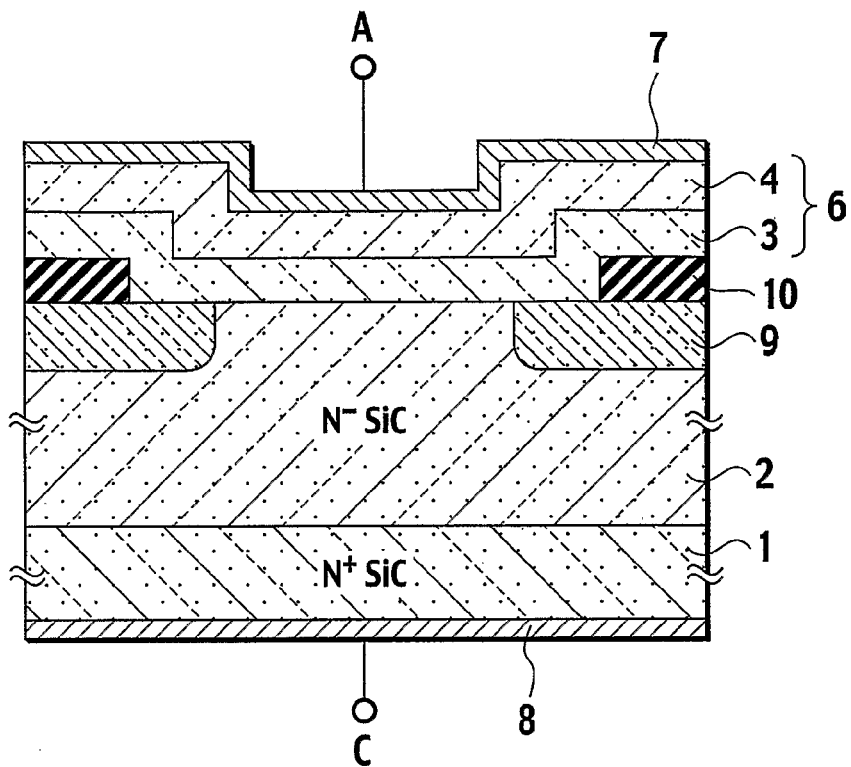
FIG. 5 is a cross-sectional view of a semiconductor device for explaining other forms of the first and second embodiments of the present invention.
Figure 6:
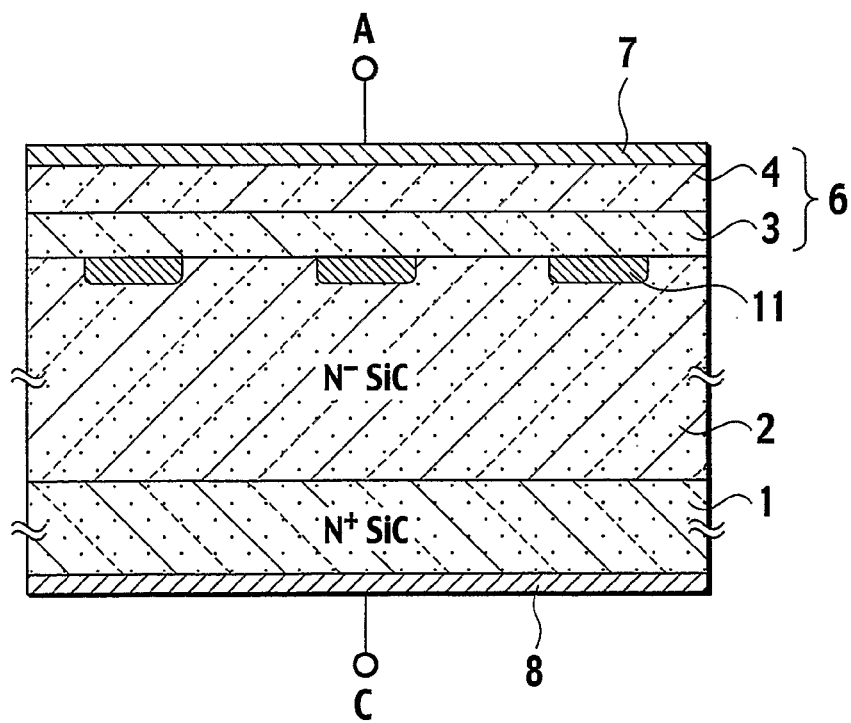
FIG. 6 is a cross-sectional view of a semiconductor device for explaining other forms of the first and second embodiments of the present invention.

In this embodiment, in order to facilitate the understanding of the description of effects produced by the formation of the laminated hetero semiconductor region 6, which is a feature of this embodiment, a description will be given for a constitution in which regions are deposited to be layered as in FIG. 1. However, as shown in FIGS. 3 to 6, the periphery or inside thereof may have other structures. For example, as shown in FIGS. 3 and 4, in order to prevent field concentration at edge portions of the laminated hetero semiconductor region 6, for example, a field limiting region 9 may be formed as a P type region (FIG. 3), or an edge portion of the laminated hetero semiconductor region 6 may be mounted on an insulating region 10 made of, for example, an oxide film (FIG. 4). It is a matter of course that both the field limiting region 9 and the insulating region 10 may be formed as shown in FIG. 5. Furthermore, as shown in FIG. 6, conducting regions 11 made of, for example, N type regions may be formed in order to realize low-resistance conduction.

Next, one example of a method of manufacturing the silicon carbide semiconductor device according to the first embodiment of the present invention which is shown in FIG. 1 will be described using FIGS. 7A to 7D.

Figure 7A:
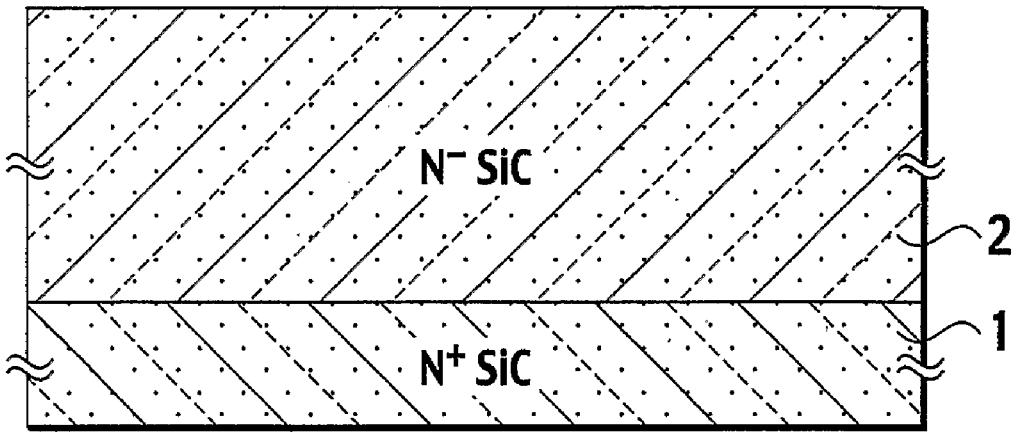
FIGS. 7A to 7D are views showing one example of a manufacturing method of the semiconductor device shown in FIGS. 1 to 6.

(1) First, as shown in FIG. 7A, for example, an N type silicon carbide semiconductor base is used which is formed by epitaxially growing the N− type epitaxial region 2 on the N+ type substrate region 1.

Figure 7B:
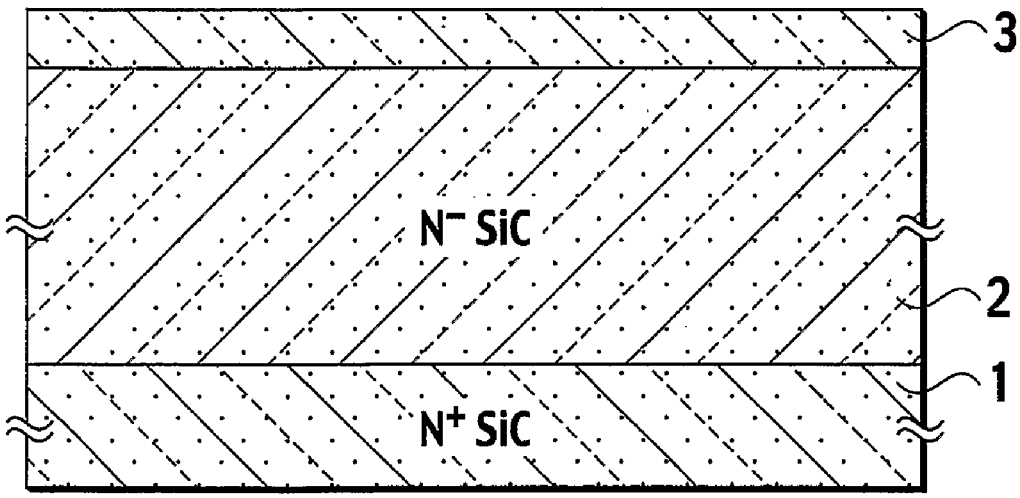

(2) Next, as shown in FIG. 7B, a first polysilicon layer is deposited by, for example, LP-CVD, and then boron doping is performed in, for example, a $BBr_3$ atmosphere, thus forming the P type lowest hetero semiconductor region 3. It should be noted that the lowest hetero semiconductor region 3 may be formed by performing deposition by electron-beam evaporation, sputtering, or the like and then performing recrystallization by laser annealing or the like, or may be formed of single-crystal silicon heteroepitaxially grown by, for example, molecular beam epitaxy or the like. Furthermore, in the doping, a combination of ion implantation and activation heat treatment after the implantation may be used.

Figure 7C:
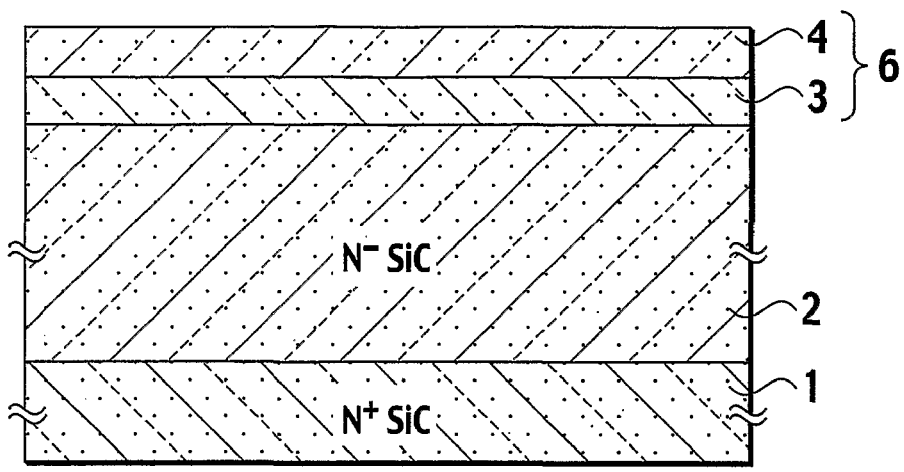

(3) Moreover, as shown in FIG. 7C, a second polysilicon layer is deposited on the lowest hetero semiconductor region 3 by, for example, LP-CVD, and then boron doping is performed in, for example, a $BBr_3$ atmosphere, thus forming the P type uppermost hetero semiconductor region 4. It should be noted that the uppermost hetero semiconductor region 4 may also be formed by performing deposition by electron-beam evaporation, sputtering, or the like and then performing recrystallization by laser annealing or the like, or may also be formed of single-crystal silicon heteroepitaxially grown by, for example, molecular beam epitaxy or the like. Furthermore, in the doping, a combination of ion implantation and activation heat treatment after the implantation may be used. As described above, the laminated hetero semiconductor region 6 is formed by the steps of depositing a plurality of polysilicon layers.

Figure 7D:
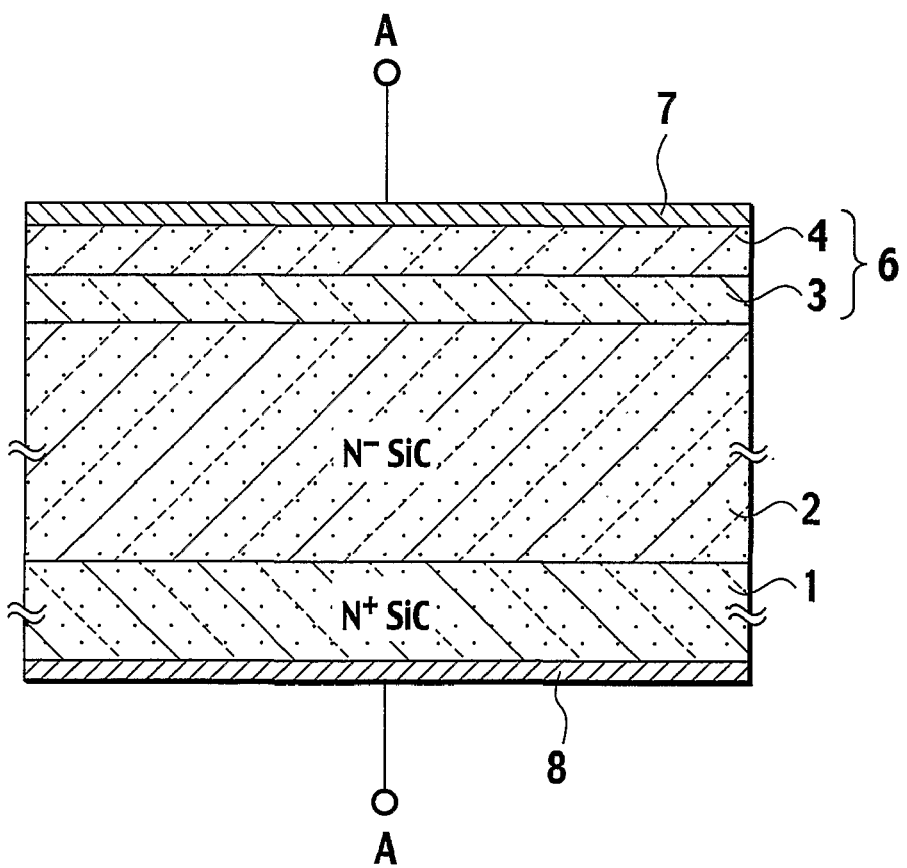

(4) Furthermore, as shown in FIG. 7D, a mask member is formed by photolithography and etching as needed, and the laminated hetero semiconductor region 6 is shaped into a predetermined shape by, for example, reactive ion etching (dry etching); the second electrode 8 made of, for example, titanium (Ti) and nickel (Ni) is formed under the substrate region 1 corresponding to the back surface side; and the first electrode 7 is formed on the uppermost hetero semiconductor region 4 corresponding to the top surface side by sequentially depositing titanium (Ti) and aluminum (Al) thereon. Thus, the semiconductor device according to the first embodiment of the present invention which is shown in FIG. 1 is completed.

As described above, the semiconductor device of this embodiment can be easily realized by conventional manufacturing technology.

Next, the operation of this embodiment will be described.

Using the second electrode 8 as a cathode electrode and the first electrode 7 as an anode electrode, when a voltage is applied therebetween, rectifying behavior occurs at the junction interface between the lowest hetero semiconductor region 3 and the epitaxial region 2, and diode characteristics are obtained.

First, when the cathode electrode is held at ground potential and a positive potential is applied to the anode electrode, forward current flows. Forward characteristics at this time are the same as those of a schottky barrier diode. That is, the forward characteristics allow forward current to flow with a voltage drop determined from the sum of respective built-in potentials extending from the heterojunction to the epitaxial region 2 and the lowest hetero semiconductor region 3.

Then, when the cathode electrode is held at ground potential and a negative potential is applied to the anode electrode, reverse characteristics of this embodiment show leakage current characteristics different from those of a schottky barrier diode. This is because in the constitution of the present invention, leakage current generated through the heterobarrier of the heterojunction interface can be greatly reduced to such an extent that leakage current characteristics due to carriers generated under a predetermined electric field such as seen in a PN junction diode become dominant, as described later.

Hereinafter, reverse characteristics will be described in detail.

Reverse characteristics of a schottky barrier diode are almost uniquely determined by the height of a schottky barrier formed by the difference between the electron affinity of a semiconductor material and the work function of schottky metal. However, in heterojunction diodes of conventional structures and this embodiment, reverse characteristics are broadly determined by three factors. The first one is reverse blocking capability determined by the height of the heterobarrier formed by the difference between the electron affinities of respective semiconductor materials, as in a schottky barrier. The second one is leakage current supplying capability determined by a source of majority carriers, which become the origin of leakage current. The third one is breakdown voltage maintaining capability determined by the potential distribution of a voltage applied to the heterojunction diode between the two semiconductor materials, which potential distribution is determined by the dielectric constants and impurity concentrations of the semiconductor materials.

The first one, reverse blocking capability, is almost determined by the respective semiconductor materials of the epitaxial region 2 made of silicon carbide and the lowest hetero semiconductor region 3 made of silicon in the case of this embodiment.

The second one, leakage current supplying capability, is significantly reduced compared to those of conventional structures, and a constitution is provided in which the origin of conduction electrons is suppressed so that conduction electrons serving as majority carriers for the N type epitaxial region 2 are less prone to be generated in the laminated hetero semiconductor region 6. That is, the laminated hetero semiconductor region 6 is formed to be of P type, and is constituted to have such an impurity concentration, a thickness, and the like that the laminated hetero semiconductor region 6 is not fully depleted. The former contributes to the laminated hetero semiconductor region 6 itself not becoming a conduction-electron source. The latter works so that conduction electrons are prevented from being supplied from, for example, the first electrode 7 by the full depletion of the laminated hetero semiconductor region 6.

Figure 8:
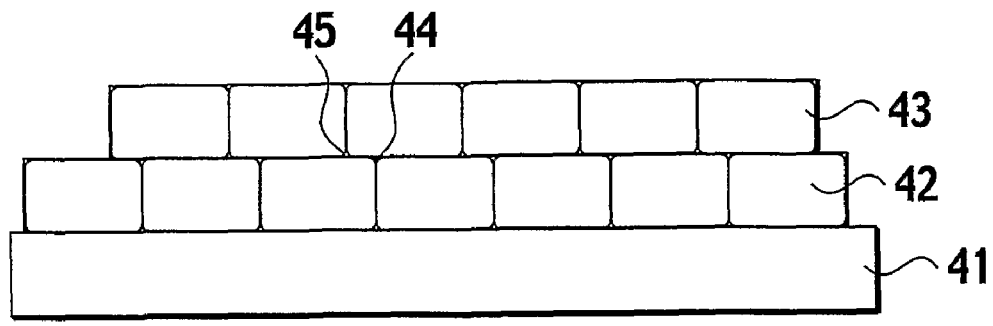
FIG. 8 is an enlarged cross-sectional view of the junction between a lowest hetero semiconductor region (polysilicon) and an uppermost hetero semiconductor region (polysilicon)

Moreover, in this embodiment, a heterojunction diode is formed using the laminated hetero semiconductor region 6 obtained by laminating hetero semiconductor regions made of polysilicon including a large number of crystal grains. Accordingly, it is possible to reduce the supply of conduction electrons serving as majority carriers for the N type epitaxial region 2 from the anode electrode through grain boundaries of polysilicon. This can be explained by a model of polysilicon constituting the laminated hetero semiconductor region 6 which is shown in FIG. 8. In FIG. 8, when a lowest polysilicon layer 42 is formed on a silicon carbide semiconductor 41, which is a substrate region, silicon grains of a predetermined size are deposited. Furthermore, when an uppermost polysilicon layer 43 is formed on the lowest polysilicon layer 42, grain boundaries 45 of the uppermost polysilicon layer are formed at arbitrary positions different from those of grain boundaries 44 of the lowest polysilicon layer which appear between the grains of the lowest polysilicon layer 42. This phenomenon has been confirmed in an experiment by the inventor of the present invention. As can be seen from the cross-sectional TEM photograph taken in the experiment, grain boundaries of the lowest polysilicon layer and those of the upper polysilicon layer are not continuous.

As described above, grain boundaries of the uppermost hetero semiconductor region 4 in contact with the first electrode 7 which is the anode electrode and grain boundaries of the lowest hetero semiconductor region 3 in contact with the epitaxial region 2 are not continuous. Accordingly, the flow of conduction electrons through grain boundaries can be reduced compared to those of conventional structures. Furthermore, leakage current can be reduced.

Figure 9:
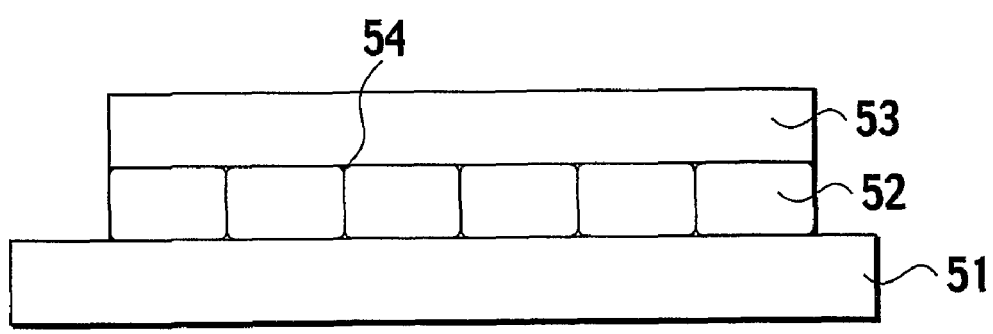
FIG. 9 is an enlarged cross-sectional view of the junction between a lowest hetero semiconductor region (polysilicon) and an uppermost hetero semiconductor region (single-crystal silicon)

In this embodiment, as one example, a description is given for the case where the uppermost polysilicon layer 43 is formed on the lowest polysilicon layer 42 and where both of them are made of polysilicon. However, also in the case where a lowest polysilicon layer 52 is formed on a silicon carbide semiconductor 51 and an uppermost single-crystal silicon layer 53 is further formed thereon as shown in FIG. 9, grain boundaries 54 of the lowest polysilicon layer do not extend into the uppermost single-crystal silicon layer 53. Thus, effects similar to those for the case shown in FIG. 8 can be obtained.

Figure 10:
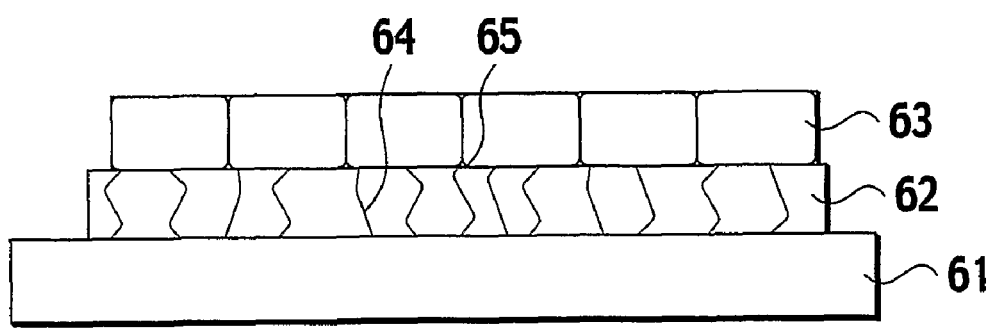
FIG. 10 is an enlarged cross-sectional view of the junction between a lowest hetero semiconductor region (single-crystal silicon) and an uppermost hetero semiconductor region (polysilicon)

Furthermore, also in the case where a lowest single-crystal silicon layer 62 is formed on a silicon carbide semiconductor 61 and an uppermost polysilicon layer 63 is further formed thereon as shown in FIG. 10, crystal defects 64 generated in the lowest single-crystal silicon 62 and grain boundaries 65 generated in the uppermost polysilicon layer 63 are not continuous. Accordingly, similar effects can be obtained.

From the viewpoint of the third one, breakdown voltage maintaining capability, obtained is the effect of reducing carriers generated under a predetermined electric field on the semiconductor material side (here, the lowest hetero semiconductor region 3 side) which has a smaller band gap. Thus, for example, the lowest hetero semiconductor region 3 made to be of P+ type provides a structure in which avalanche breakdown is less prone to occur.

As described above, in this embodiment, a constitution in which full depletion does not occur is obtained by making the lowest hetero semiconductor region 3 be of P+ type in the case where the epitaxial region 2 is of N type, thus reducing leakage current. Furthermore, in order to utilize the feature of the epitaxial region 2 that the proportion of occurrence of leakage current is small, the impurity concentration of the lowest hetero semiconductor region 3 is made high.

Moreover, in this embodiment, a heterojunction diode is formed using the laminated hetero semiconductor region 6 while polysilicon including a large number of crystal grains is used. Accordingly, it is possible to reduce the amount of conduction electrons supplied through grain boundaries of the polysilicon from the anode electrode, which serve as majority carriers for the N type epitaxial region 2. Furthermore, a structure is provided in which leakage current is less prone to occur.

With the above-described constitution, the supply of electrons from the lowest hetero semiconductor region 3 is drastically reduced in the case where a reverse bias is applied between the anode and cathode of the heterojunction diode. Accordingly, leakage current is greatly reduced.

Second Embodiment

In the first embodiment, a description has been given for the case where both the lowest and uppermost hetero semiconductor regions 3 and 4 are of P+ type. This embodiment is the case where the lowest hetero semiconductor region 3 is of P− type in which the impurity concentration is smaller than that of the uppermost hetero semiconductor region 4, and will also be described using FIG. 1.

With the above-described constitution, the following effects can be obtained. That is, when the second electrode 8 as a cathode electrode is held at ground potential and a positive potential is applied to the first electrode 7 as an anode electrode, forward current flows. Forward characteristics at this time are the same as those of a schottky barrier diode. However, in this embodiment, since the lowest hetero semiconductor region 3 is of P− type, forward current can be allowed to flow with a small voltage drop compared to that for the case of P+ type which is shown in the first embodiment. This makes it possible to reduce loss for the case where current flows forward.

Furthermore, even in the case where the cathode electrode is held at ground potential and a negative potential is applied to the anode electrode, three factors of reverse characteristics are obtained: reverse blocking capability determined by the height of a heterobarrier, leakage current supplying capability determined by a source of majority carriers which become the origin of leakage current, and breakdown voltage maintaining capability determined by potential distribution between the two semiconductor materials. Accordingly, low leakage current characteristics are shown.

Moreover, also in this embodiment, grain boundaries of the uppermost hetero semiconductor region 4 in contact with the first electrode 7 as the anode electrode and grain boundaries of the lowest hetero semiconductor region 3 in contact with the epitaxial region 2 are not continuous. Accordingly, conduction electrons passing through grain boundaries can be reduced, and further, leakage current can be reduced. It should be noted that in this embodiment, constitutions obtained by modifying the basic structure such as shown in FIGS. 2 to 6 may be employed as in the first embodiment.

Next, one example of a particularly characteristic manufacturing method of this embodiment will be described using FIGS. 7A to 7D.

(1) First, as shown in FIG. 7A, for example, an N type silicon carbide semiconductor base is used which is formed by epitaxially growing the N− type epitaxial region 2 on the N+ type substrate region 1, as in the first embodiment.

(2) Next, as shown in FIG. 7B, a first polysilicon layer (lowest hetero semiconductor region 3) is deposited by, for example, LP-CVD.

Figure 11:
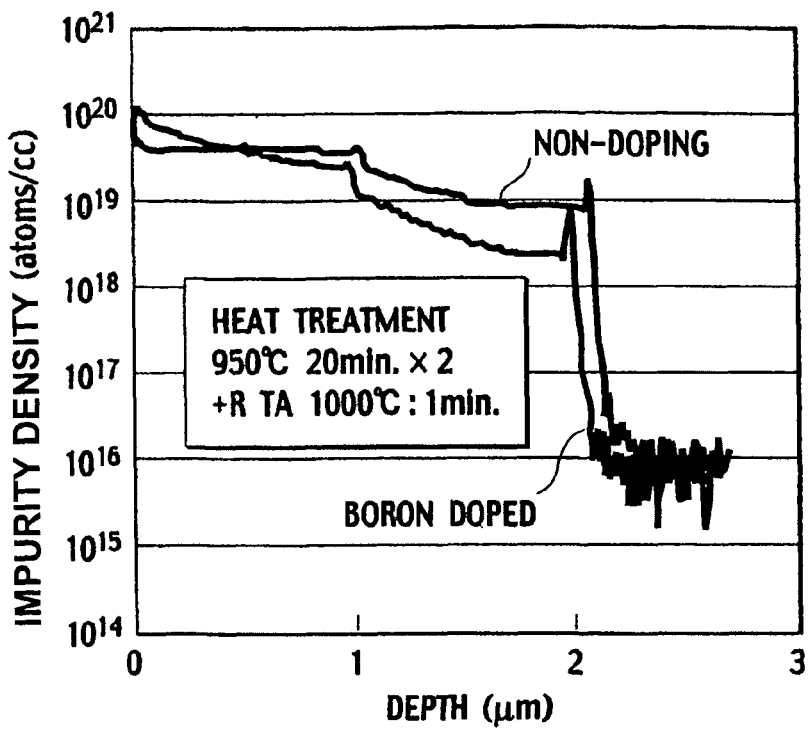
FIG. 11 is a view showing one example of the result of an experiment on an impurity diffusion distribution at the junction between the lowest hetero semiconductor region (polysilicon) and the uppermost hetero semiconductor region (polysilicon)

(3) Then, as shown in FIG. 7C, a second polysilicon layer (uppermost hetero semiconductor region 4) is further deposited on the lowest hetero semiconductor region 3 by, for example, LP-CVD. Subsequently, for example, using boron, ion implantation doping is performed on the second polysilicon layer (uppermost hetero semiconductor region 4), and predetermined activation heat treatment is performed. Then, as apparent from the result of an experiment by the inventor of the present invention which is shown in FIG. 11, impurity concentration becomes discontinuous at the junction between the second polysilicon layer and the first polysilicon layer (impurity concentrations in the layers differ on opposite sides of the junction lying at a depth of approximately 1 μm). Thus, the P− type lowest hetero semiconductor region 3 and the uppermost hetero semiconductor region 4 can be formed at once before the doping step, and an impurity can be introduced into a plurality of layers by one doping step. This simplifies a manufacturing process and enables manufacturing at low cost. At the boundary between the lowest and uppermost hetero semiconductor regions 3 and 4 formed as described above, impurity concentration is discontinuous as shown in FIG. 11.

A large difference between this embodiment and the second embodiment is that an impurity is introduced into the uppermost hetero semiconductor region 4 and also into the uppermost hetero semiconductor region 4 by the step of introducing the impurity into the uppermost hetero semiconductor region 4. Furthermore, in general, in the process of forming the uppermost polysilicon layer on the lowest polysilicon layer or one or more intermediate polysilicon layers superposed on the top of the lowest polysilicon layer and introducing an impurity into the uppermost polysilicon layer at a predetermined concentration, the impurity can also be introduced into the lowest polysilicon layer at a concentration different from the predetermined concentration.

(4) Finally, as in the first embodiment, as shown in FIG. 7D, a mask member is formed by photolithography and etching as needed, and the laminated hetero semiconductor region 6 is shaped into a predetermined shape by, for example, reactive ion etching (dry etching); the second electrode 8 made of, for example, titanium (Ti) and nickel (Ni) is formed under the substrate region 1 corresponding to the back surface side; and the first electrode 7 is formed on the uppermost hetero semiconductor region 4 corresponding to the top surface side by sequentially depositing titanium (Ti) and aluminum (Al) thereon. Thus, a semiconductor device according to the second embodiment of the present invention which is shown in FIG. 1 is completed.

As described above, in the semiconductor device of this embodiment, on-loss can be reduced, and a manufacturing process can be simplified.

Third Embodiment

In the first embodiment, a description has been given for the case where both the lowest and uppermost hetero semiconductor regions 3 and 4 are of P+ type. In the second embodiment, a description has been given for the case where the lowest hetero semiconductor region 3 is of P− type in which the impurity concentration is smaller than that of the uppermost hetero semiconductor region 4. In this embodiment, a description will be given for the case where the lowest hetero semiconductor region 3 includes a first lowest hetero semiconductor region 23 of P+ type and second lowest hetero semiconductor regions 24 of P− type as shown in FIG. 12.

Figure 12:
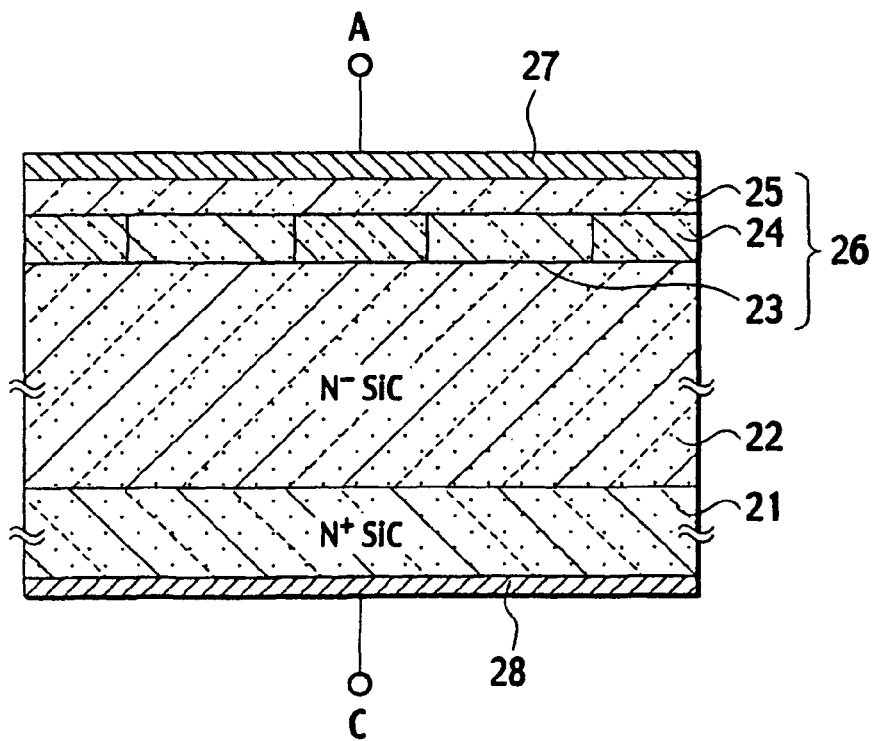
FIG. 12 is a cross-sectional view of a semiconductor device for explaining a third embodiment of the present invention.

In FIG. 12, for example, an N− type epitaxial region 22 is formed on an N+ type substrate region 21 in which the polytype of silicon carbide is 4H type. It should be noted that also in this embodiment, a description will be given using as one example a substrate in which an epitaxial region 22 is formed on a substrate region 21, but that a substrate may be used which is formed only of the substrate region 21 having an appropriate resistivity.

The first lowest hetero semiconductor region 23 of P+ type and the second lowest hetero semiconductor regions 24 of P− type are formed in contact with the main surface of the epitaxial region 22 which is opposite from the bonded surface thereof with the substrate region 21. Also in this embodiment, shown is the case where the first and second lowest hetero semiconductor regions 23 and 24 are made of polysilicon having a band gap smaller than that of silicon carbide. Furthermore, an uppermost hetero semiconductor region 25 made of P+ type polysilicon is formed to be superposed on the top surface of the first and second lowest hetero semiconductor regions 23 and 24. Also in this embodiment, the hetero semiconductor region 26 including two layers is shown as an example. However, as in FIG. 2 shown in the first embodiment, the hetero semiconductor region 26 may include three or more layers.

Moreover, a first electrode 28 is formed on the upper surface of the uppermost hetero semiconductor region 25, and a second electrode 28 is formed under the substrate region 21. The first electrode 27 forms an ohmic contact to the uppermost hetero semiconductor region 25, and the second electrode 8 forms an ohmic contact to the substrate region 21. It should be noted that also in this embodiment, in order to facilitate the understanding of the description of effects produced by the formation of the laminated hetero semiconductor region 26, which is a feature of this embodiment, a description will be given for a basic structure. However, as shown in FIGS. 3 to 6 in the first embodiment, other structures may be added to the periphery or inside thereof.

Next, one example of a method of manufacturing a silicon carbide semiconductor device according to the third embodiment of the present invention which is shown in FIG. 12 will be described as to only steps different from those of the first embodiment, using FIGS. 13A and 13B.

Figure 13A:
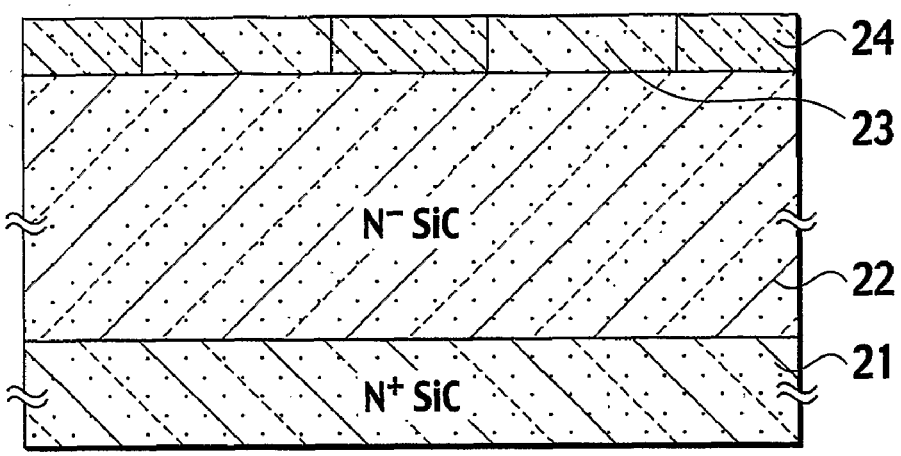
FIGS. 13A and 13B are views showing one example of a manufacturing method of the semiconductor device sown in FIG. 12.

(1) First, as shown in FIG. 13A, using a mask member formed by predetermined photolithography and etching, boron doping is performed at predetermined intervals at predetermined concentrations by, for example, ion implantation on a first polysilicon layer deposited on an N type silicon carbide semiconductor base formed by epitaxially growing the N− type epitaxial region 22 on the N+ type substrate region 21, thus forming the first lowest hetero semiconductor region 23 of P+ type and the second lowest hetero semiconductor regions 24 of P− type.

Figure 13B:
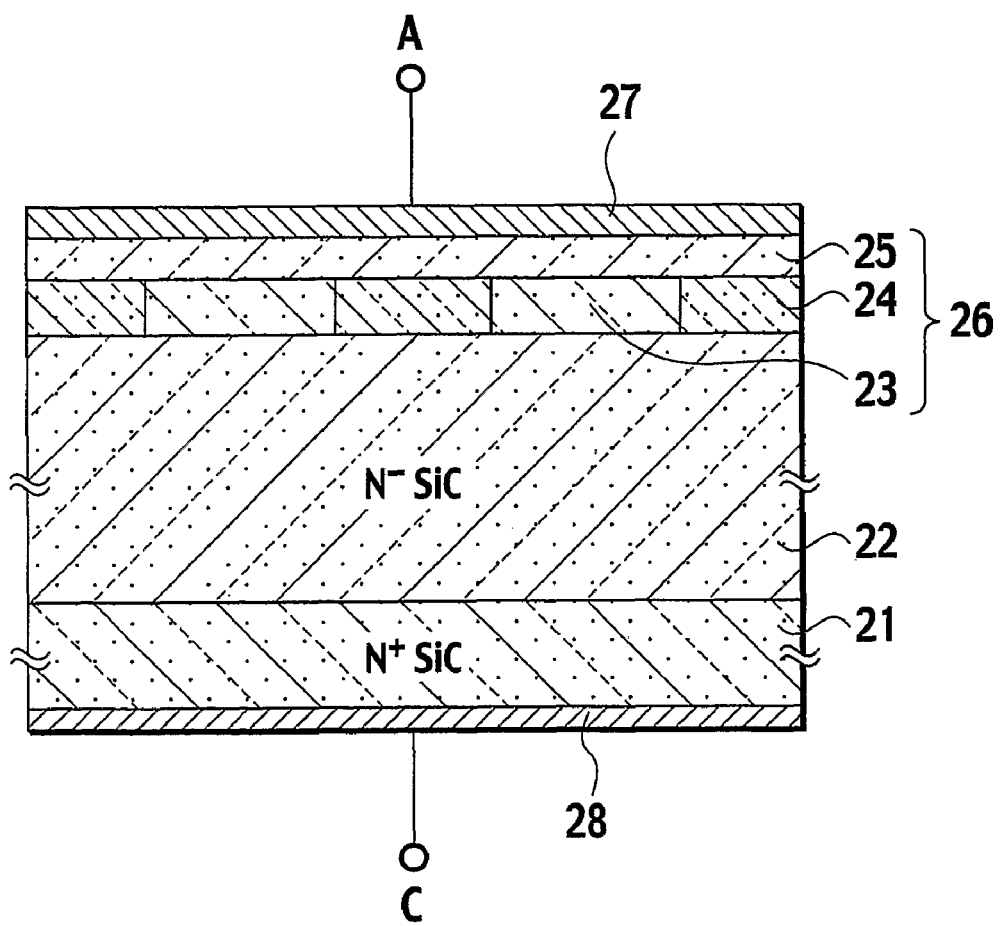

(2) Furthermore, as shown in FIG. 13B, a second polysilicon layer is deposited on the first lowest hetero semiconductor region 23 of P+ type and the second lowest hetero semiconductor regions 24 of P− type, and then boron doping is similarly performed by, for example, ion implantation, thus forming the uppermost hetero semiconductor region 25 of P type. Furthermore, after predetermined activation heat treatment is performed, the second electrode 28 made of, for example, titanium (Ti) and nickel (Ni) is formed under the substrate region 21 corresponding to the back surface side; and the first electrode 27 is formed on the uppermost hetero semiconductor region 25 corresponding to the top surface side by sequentially depositing titanium (Ti) and aluminum (Al) thereon. Thus, the semiconductor device according to the third embodiment of the present invention which is shown in FIG. 12 is completed.

As described above, the semiconductor device of this embodiment can be easily realized by conventional manufacturing technology.

With the above-described constitution, the following effects can be obtained.

When the second electrode 28 as a cathode electrode is held at ground potential and a positive potential is applied to the first electrode 27 as an anode electrode, the semiconductor device operates like a schottky barrier diode in terms of forward characteristics. However, in this embodiment, since the second lowest hetero semiconductor regions 24 are of P− type, forward current can be allowed to flow with a small voltage drop compared to that for the case of P+ type which is shown in the first embodiment. This makes it possible to reduce loss for the case where current flows forward.

On the other hand, even in the case where the cathode electrode is held at ground potential and a negative potential is applied to the anode electrode, three factors of reverse characteristics are obtained: reverse blocking capability determined by the height of a heterobarrier, leakage current supplying capability determined by a source of majority carriers which become the origin of leakage current, and breakdown voltage maintaining capability determined by potential distribution between the two semiconductor materials. Accordingly, low leakage current characteristics are shown.

Furthermore, also in this embodiment, grain boundaries of the uppermost hetero semiconductor region 25 in contact with the first electrode 27 as the anode electrode and grain boundaries of the first and second lowest hetero semiconductor regions 23 and 24 in contact with the epitaxial region 22 are not continuous. Accordingly, conduction electrons passing through grain boundaries can be reduced, and further, leakage current can be reduced.

Moreover, unlike the second embodiment, in this embodiment, the first lowest hetero semiconductor region 23 of P+ type which forms a heterojunction with the epitaxial region 22 has low resistance. Accordingly, positive holes generated when avalanche breakdown occurs, which occurs in the case where a negative potential of not less in magnitude than a predetermined value is applied to the anode electrode, can be immediately ejected to the first electrode 7 through the first lowest hetero semiconductor region 23 and the uppermost hetero semiconductor region 25. Thus, breakdown resistance at the time of avalanche breakdown can be improved.

As described above, in the semiconductor device of this embodiment, on-loss can be reduced, and breakdown resistance during reverse operation can be improved.

Fourth Embodiment

Figure 14:
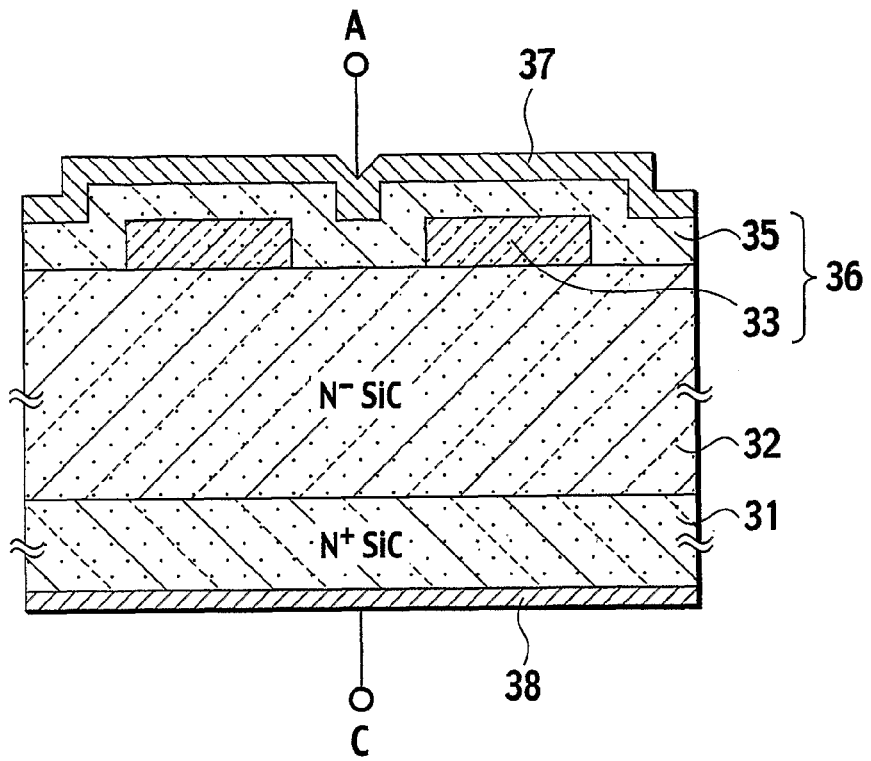
FIG. 14 is a cross-sectional view of a semiconductor device for explaining a fourth embodiment of the present invention.

In the above-described third embodiment, a description has been given for the case where the first and second lowest hetero semiconductor regions 23 and 24 are formed by introducing an impurity into the first polysilicon layer at two impurity concentrations at predetermined intervals. In this embodiment, a description will be given for the case where both a lowest hetero semiconductor region 33 of P− type and an uppermost hetero semiconductor region 35 of P+ type are in contact with an epitaxial region 32 as shown in FIG. 14.

With the above-described constitution, the following effects can be obtained.

During forward operation in which a second electrode 38 as a cathode electrode is held at ground potential and in which a positive potential is applied to a first electrode 37 as an anode electrode, forward current flows to the heterojunction between the P− type lowest hetero semiconductor region 33 and the epitaxial region 32 mainly through the uppermost hetero semiconductor region 35 forming an ohmic contact to the first electrode 37. Accordingly, current can be allowed to flow with a low voltage drop as in the third embodiment. This makes it possible to reduce loss for the case where current flows forward.

On the other hand, even in the case where the cathode electrode is held at ground potential and a negative potential is applied to the anode electrode, this embodiment has three factors of reverse characteristics: reverse blocking capability determined by the height of a heterobarrier, leakage current supplying capability determined by a source of majority carriers which become the origin of leakage current, and breakdown voltage maintaining capability determined by potential distribution between the two semiconductor materials. Accordingly, low leakage current characteristics are shown as in the third embodiment.

Furthermore, in this embodiment, the epitaxial region 32 and the P+ type uppermost hetero semiconductor region 35 forming a heterojunction therewith are in direct contact with each other. Accordingly, positive holes generated when avalanche breakdown occurs, which occurs in the case where the potential of the anode electrode becomes a negative potential of not less in magnitude than a predetermined value, can be immediately ejected to the first electrode 37 through only the uppermost hetero semiconductor region 35. Thus, breakdown resistance at the time of avalanche breakdown can be further improved.

Figure 15A:
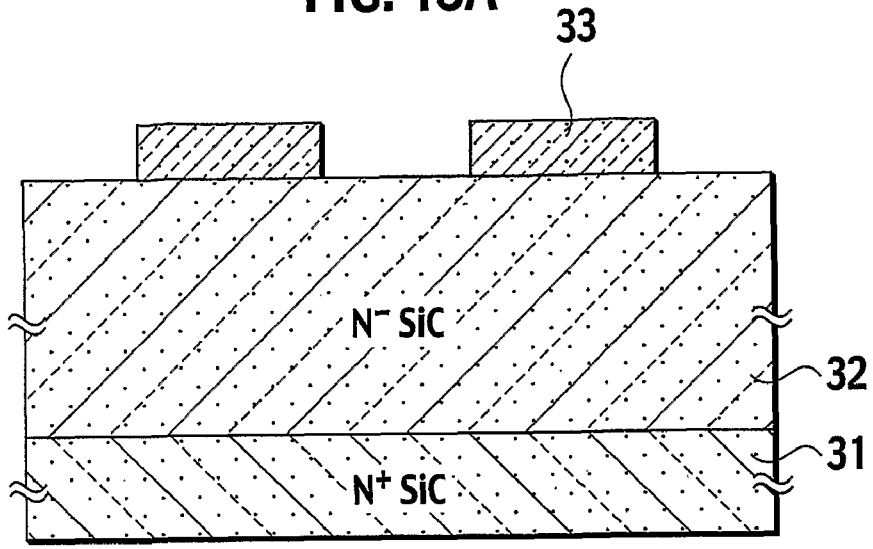
FIGS. 15A and 15B are views showing one example of a manufacturing method of the semiconductor device sown in FIG. 14.
Figure 15B:
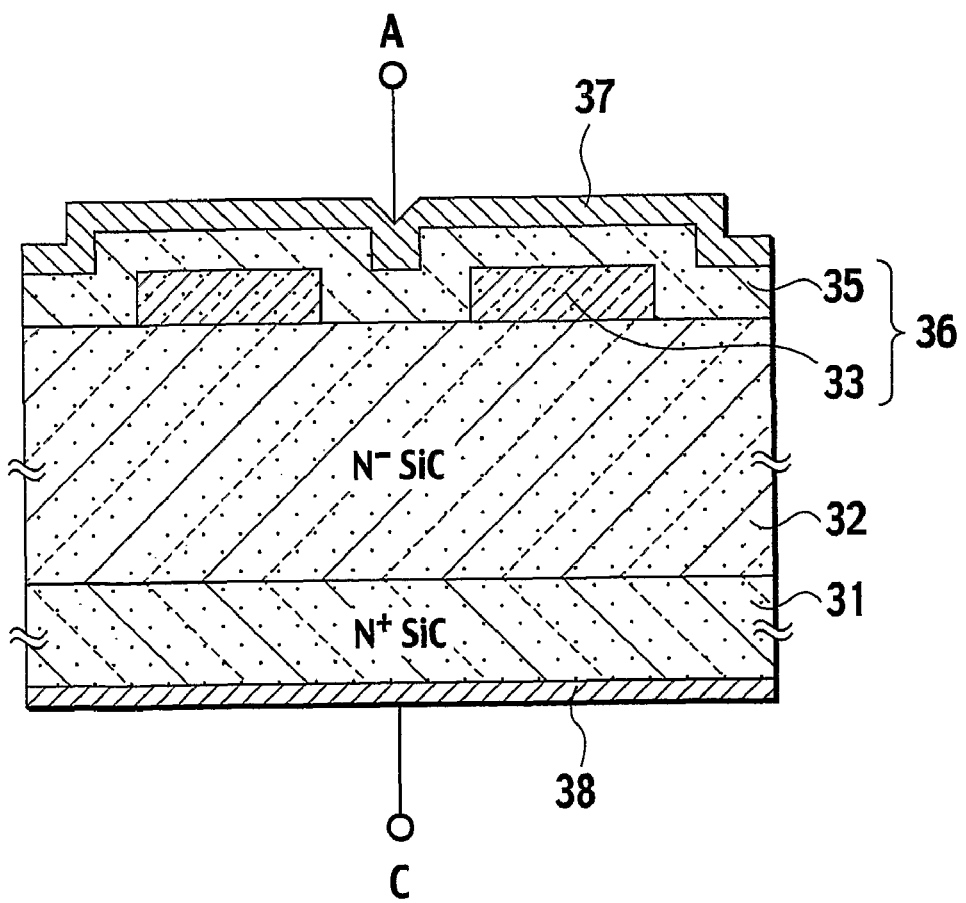

As for a manufacturing process, only characteristic steps are shown in FIGS. 15A and 15B.

(1) First, as shown in FIG. 15A, a first polysilicon layer deposited on an N type silicon carbide semiconductor base including an N+ type substrate region 31 and the N− type epitaxial region 32 is shaped into a predetermined shape by, for example, reactive ion etching (dry etching) using a mask member formed by predetermined photolithography and etching.

(2) Furthermore, as shown in FIG. 15B, after a second polysilicon layer is deposited, boron doping is performed by ion implantation, and predetermined activation heat treatment is performed. Then, as apparent from the result of an experiment by the inventor of the present invention which is shown in FIG. 11, impurity concentration becomes discontinuous at the junction between the second polysilicon layer and the first polysilicon layer. Thus, the P− type lowest hetero semiconductor region 33 and the uppermost hetero semiconductor region 35 can be formed at the same time. This simplifies a manufacturing process and enables manufacturing at low cost. Thereafter, the second electrode 38 made of, for example, titanium (Ti) and nickel (Ni) is formed under the substrate region 31 corresponding to the back surface side; and the first electrode 37 is formed on the uppermost hetero semiconductor region 35 corresponding to the top surface side by sequentially depositing titanium (Ti) and aluminum (Al) thereon. Thus, a semiconductor device according to the fourth embodiment of the present invention which is shown in FIG. 14 is completed.

Moreover, in general, after the lowest polysilicon layer is selectively etched using a predetermined mask pattern before the step of forming the uppermost polysilicon layer is executed, the uppermost polysilicon layer can be formed by performing the step of forming the uppermost polysilicon layer to be in direct contact with the semiconductor base or be adjacent thereto across one or more intermediate polysilicon layers.

As described above, in the semiconductor device of this embodiment, breakdown resistance can be further improved, and a simplified manufacturing process can be realized.

It should be noted that in this embodiment, constitutions corresponding to FIGS. 2 to 6 which are obtained by modifying the basic structure may be employed, as described in the first embodiment.

Fifth Embodiment

Figure 16:
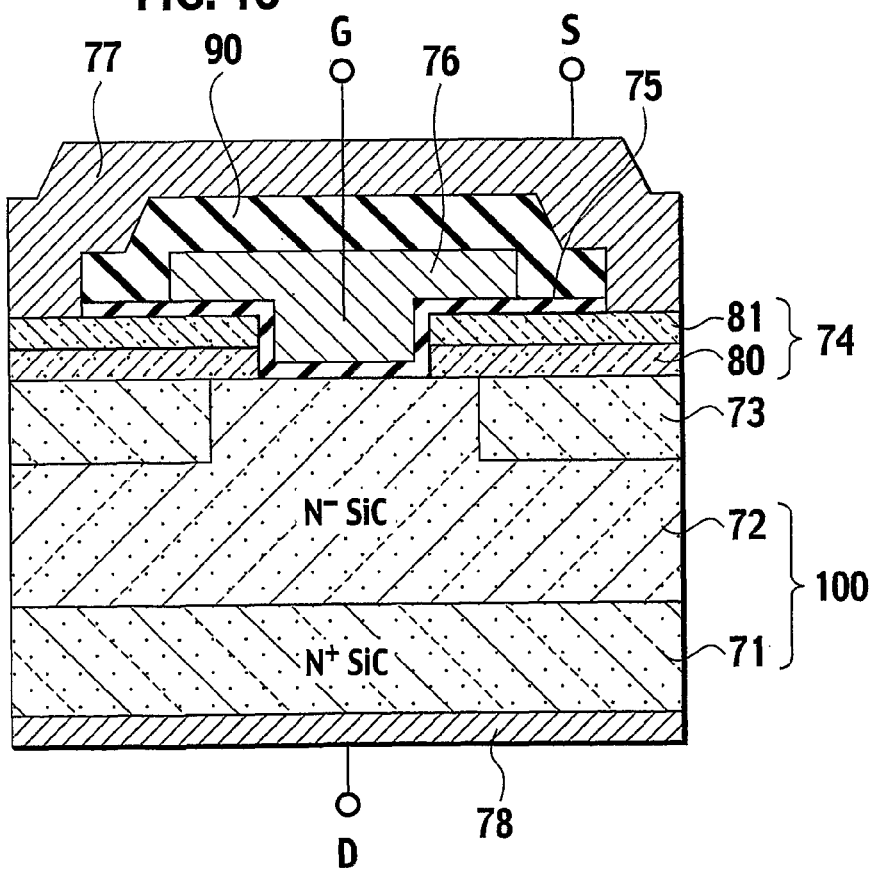
FIG. 16 is a cross-sectional view of a semiconductor device for explaining a fifth embodiment of the present invention.

FIG. 16 shows a cross-sectional view of a semiconductor device according to the fifth embodiment of the present invention which has a gate electrode and which functions as a field-effect transistor. In this drawing, a field limiting region 73 is formed in a predetermined region on a first main surface side of a semiconductor base 100 obtained by forming on a heavily doped N type silicon carbide substrate 71 an N type silicon carbide epitaxial layer 72 having an impurity concentration lower than that of the silicon carbide substrate 71. Furthermore, a hetero semiconductor region 74 in which N type polysilicon layers 80 and 81 forming a heterojunction and having a band gap different from that of silicon carbide are superposed is formed in a predetermined region on the first main surface side of the semiconductor base 100. The polysilicon layers 80 and 81 correspond to lowest and uppermost semiconductor layers of the hetero semiconductor region 74, respectively. A gate electrode 76 is formed to be adjacent to the junction between the hetero semiconductor region 74 and the semiconductor base 100 across a gate insulating film 75. A source electrode 77 which is a first electrode is formed to be connected to the hetero semiconductor region 74, and a drain electrode 78 which is a second electrode is formed to form an ohmic contact to the semiconductor base 100. Moreover, the source electrode 77 and the gate electrode 76 are electrically insulated from each other by an interlayer insulating film 90. It should be noted that though not shown in FIG. 16, the field limiting region 73 and the source electrode 77 are in contact with each other in the depth direction of the drawing.

Hereinafter, a method of manufacturing a semiconductor device according to this embodiment of the present invention will be described using FIGS. 17A to 17F.

Figure 17A:
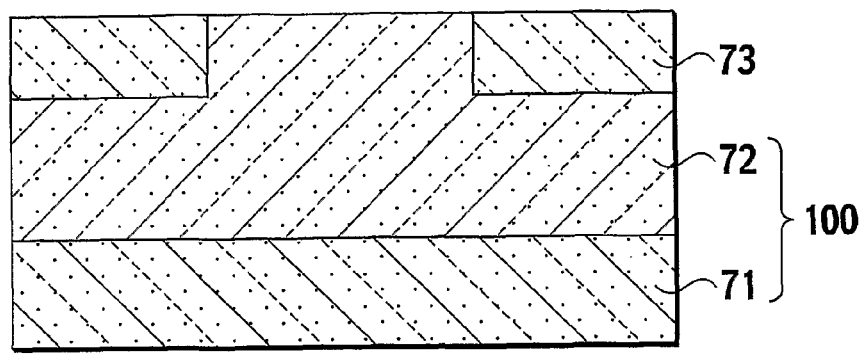
FIGS. 17A to 17F are views showing one example of a manufacturing method of the semiconductor device shown in FIG. 16.

As shown in FIG. 17A, the semiconductor base 100 is prepared in which the N type silicon carbide epitaxial layer 72 having an impurity concentration lower than that of the silicon carbide substrate 71 is formed on the heavily doped N type silicon carbide substrate 71. Then, the field limiting region 73 is formed in a predetermined region. For the field limiting region 73, for example, P type silicon carbide or an insulating layer can be used.

Figure 17B:
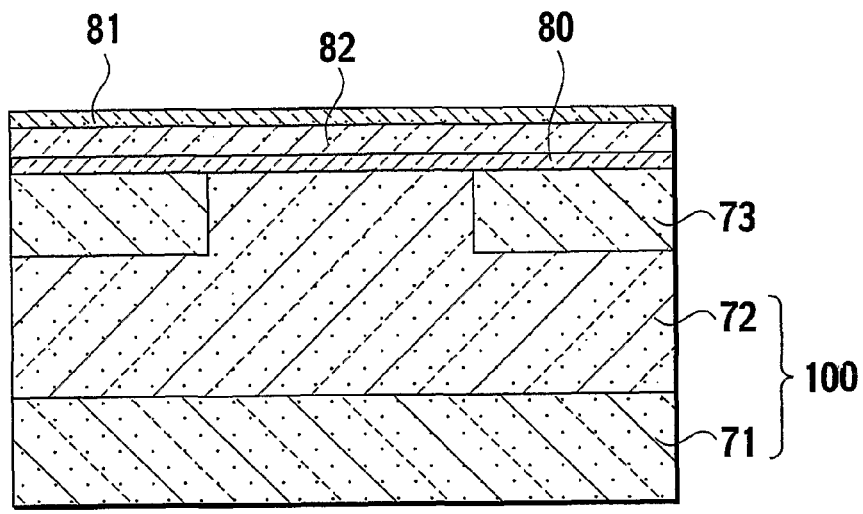

Next, as shown in FIG. 17B, the polysilicon layer 80, an amorphous silicon layer 82, and the polysilicon layer 81 are consecutively deposited in this order by, for example, CVD or the like with deposition temperature continuously changed. Deposition temperature conditions at this time are, for example, as follows: the deposition temperature for the polysilicon layers 80 and 81 is 620° C., and that for the amorphous silicon layer 82 is 520° C. As for film thicknesses, for example, those of the polysilicon layers 80 and 81 are approximately 20 nm, and that of the amorphous silicon layer 82 is 500 nm. By continuously changing deposition temperature and consecutively forming the layers as described above, the laminated structure such as shown in the drawing can be easily formed.

Figure 17C:
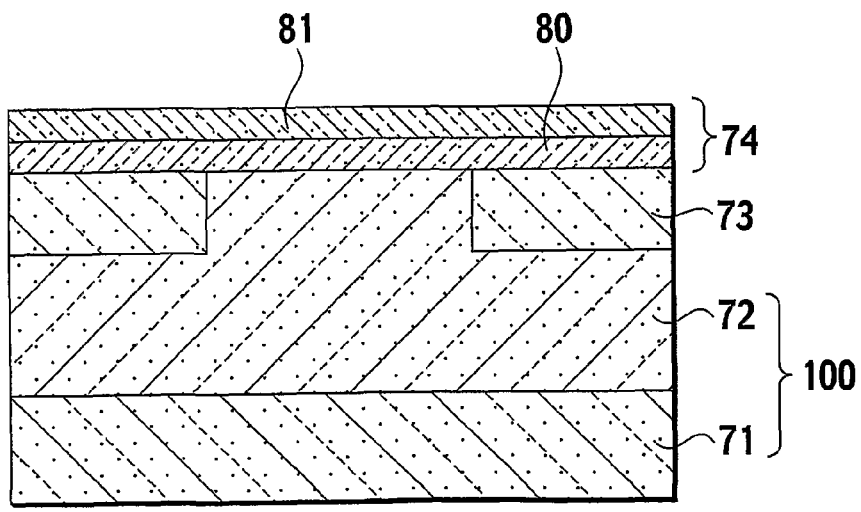

Next, as shown in FIG. 17C, heat treatment is performed in a nitrogen atmosphere to cause solid-phase crystal growth in the amorphous silicon layer 82 with the upper and lower polysilicon layers 81 and 80 being used as a seed layer, thus crystallizing the amorphous silicon layer 82 by solid-phase crystal growth. At this time, crystal grains (grains) grown from the upper and lower polysilicon layers 81 and 80 by solid-phase growth hit each other in the middle of the amorphous silicon layer 82, thus forming a hetero semiconductor region 74 having a structure in which the two polysilicon layers 81 and 80 are superposed as shown in the drawing. Furthermore, a portion in which crystal grain alignment is discontinuous is formed between the two polysilicon layers 81 and 80.

With the above-described steps, the surface layer of each layer is not exposed to air because layers are consecutively formed unlike those in the case where a portion in which crystal grain alignment is discontinuous is formed by performing deposition for each layer. Accordingly, a native oxide film is not formed in the portion in which crystal grain alignment is discontinuous, and an impurity is not attached thereto.

Figure 18:
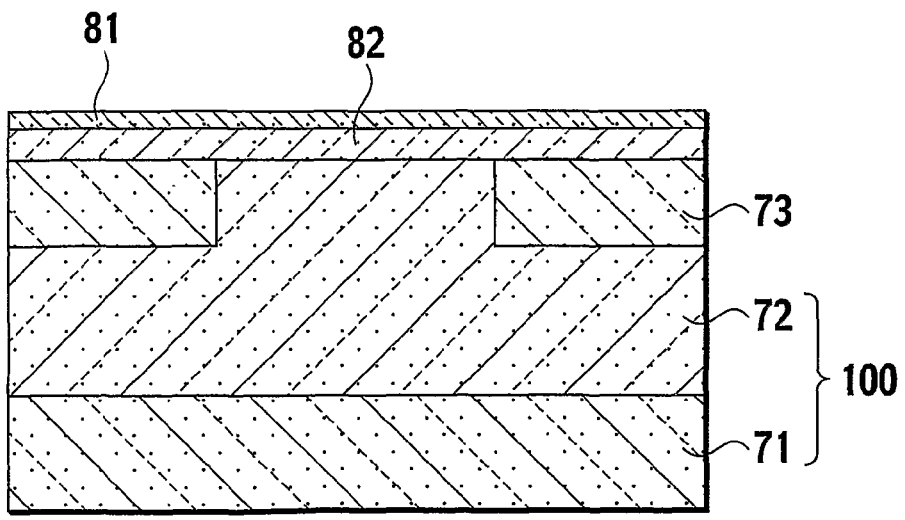
FIG. 18 is a view showing an example in which the manufacturing method of the fifth embodiment of the present invention is partially modified.

Here, a description is given of the case where the layer structure of the hetero semiconductor region 74 before solid-phase growth is the polysilicon layer 80/the amorphous silicon layer 82/the polysilicon layer 81. However, similar steps may be employed also in the case where the number of layers is different. For example, as shown in FIG. 18, the amorphous silicon layer 82 and the polysilicon layer 81 may be deposited in this order on the silicon carbide epitaxial layer 72 of the semiconductor base 100, and then heat treatment may be performed to cause solid-phase growth in the amorphous silicon layer 82, thus crystallizing the amorphous silicon layer 82 by solid-phase growth. In this case, at the interface between the polysilicon layer 81 and the amorphous silicon layer 82, solid-phase crystal growth occurs in the amorphous silicon layer 82 with the polysilicon layer 81 being used as a seed layer. On the other hand, at the interface between the silicon carbide epitaxial layer 72 and the amorphous silicon layer 82, the crystallization of the amorphous silicon layer 82 proceeds based on crystal nuclei generated in a random manner, and a layer corresponding to the polysilicon layer 80 is formed. Also in this case, crystal grains grown from above and below hit each other, thus forming a portion in which crystal grain alignment is discontinuous.

Figure 17D:
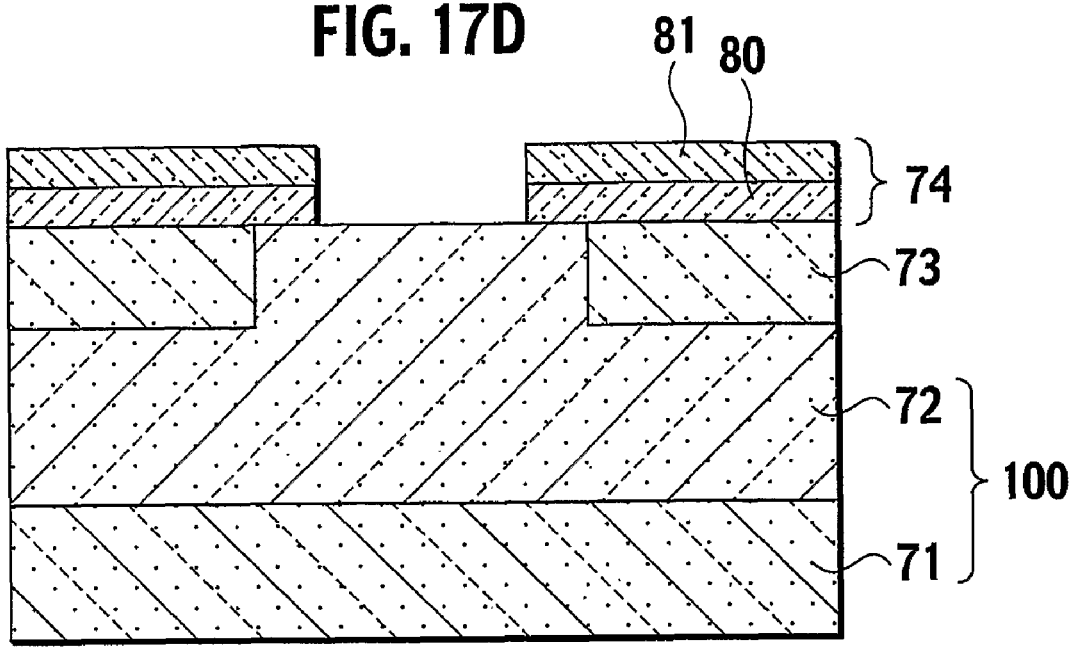

Next, ions of arsenic are implanted into the hetero semiconductor region 74 including the plurality of polysilicon layers 80 and 81, and activation heat treatment is performed to make the hetero semiconductor region 74 be of N type. It should be noted that other than ion implantation, diffusion or the like may be used as an impurity introduction method. Thereafter, as shown in FIG. 17D, the hetero semiconductor region 74 is patterned by photolithography and etching.

Figure 17E:
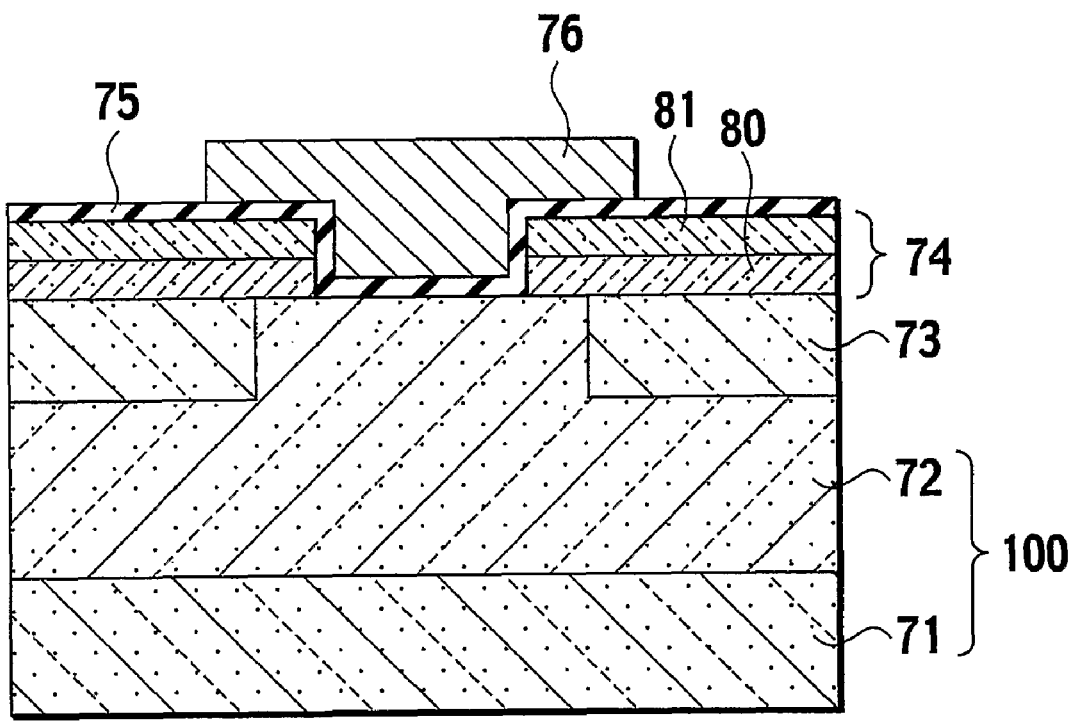

Then, after the gate insulating film 75 is deposited and aluminum which becomes the gate electrode 76 is further deposited, the aluminum is patterned by photolithography and etching to form the gate electrode 76 as shown in FIG. 17E.

Figure 17F:
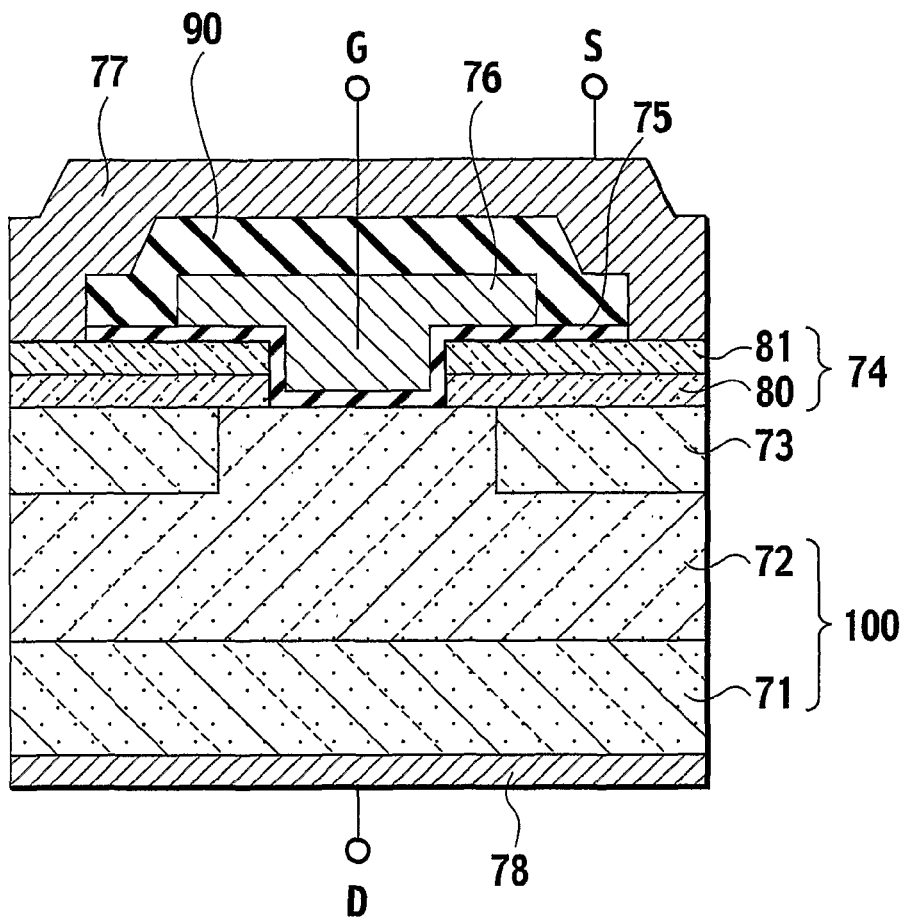

Subsequently, after the interlayer insulating film 90 is deposited, a contact hole is made by photolithography and etching, and the source electrode 77 is formed to be in contact with the hetero semiconductor region 74. Furthermore, the drain electrode 78 is formed to be in contact with the silicon carbide substrate 71. Thus, as shown in FIG. 17F, a semiconductor device according to this embodiment of the present invention is completed.

The operation of the semiconductor device as a specific semiconductor element manufactured as described above will be described.

This element is used with the source electrode 77 being grounded and a positive drain voltage being applied to the drain electrode 78. If the gate electrode 76 is grounded at this time, electron transfer is blocked by an energy barrier at the heterojunction interface, and therefore current does not flow between the source electrode 77 and the drain electrode 78, whereby a cutoff state is established. Furthermore, in the case where a high voltage is applied between the source electrode 77 and the drain electrode 78, breakdown does not occur in the hetero semiconductor region 74 because an electric field is terminated by an accumulation layer formed on the hetero semiconductor region 74 side of the heterojunction interface, and an electric field applied to the heterojunction interface is reduced by the field limiting region 73. Accordingly, high breakdown voltage between the source electrode 77 and the drain electrode 78 can be ensured.

Moreover, as in the first to fourth embodiments, the hetero semiconductor region 74 is provided which includes the polysilicon layers 80 and 81 and in which crystal alignment is discontinuous between the layers. Accordingly, reverse leakage current can be further reduced compared to that for the case where a single layer of polysilicon is used for the hetero semiconductor region 74.

Next, when an appropriate positive voltage is applied to the gate electrode 76, electrons are accumulated in the hetero semiconductor region 74 and the silicon carbide epitaxial layer 72 adjacent to the gate insulating film 75. As a result, current flows between the source electrode 77 and the drain electrode 78 at a predetermined drain voltage. That is, a conducting state is established.

Furthermore, when the positive voltage applied to the gate electrode 76 is removed, a layer in which electrons are accumulated disappears from the hetero semiconductor region 74 and the silicon carbide epitaxial layer 72 adjacent to the gate insulating film 75. Electrons are blocked by an energy barrier at the heterojunction interface, and a cutoff state is established.

The semiconductor device of this embodiment has the following structure: the laminated hetero semiconductor region 6 and the first electrode 7 of the semiconductor device shown in FIG. 3 are partially removed; the gate insulating film 75 and the gate electrode 76 are provided in the removed portion; and the gate electrode 76 is adjacent to the junction between the laminated hetero semiconductor region 6 and the semiconductor base across the gate insulating film 75. Similarly, a semiconductor device can be constructed which has the following structure: the laminated hetero semiconductor region 6, 26, or 36 and the first electrode 7, 27, or 37 of the semiconductor device shown in FIG. 1, 2, 4, 5, 6, 12, or 14 are partially removed; the gate insulating film 75 and the gate electrode 76 are provided in the removed portion; and the gate electrode 76 is adjacent to the junction between the laminated hetero semiconductor region 6, 26, or 36 and the semiconductor base across the gate insulating film 75. In this case, the substrate region 1, 21, or 31 corresponds to the silicon carbide substrate 71; the epitaxial region 2, 22, or 32 corresponds to the silicon carbide epitaxial layer 72; the lowest hetero semiconductor region 3, 23, 24, or 33 corresponds to the polysilicon layer 80; the uppermost hetero semiconductor region 4, 25, or 35 corresponds to the polysilicon layer 81; the laminated hetero semiconductor region 6, 26, or 36 corresponds to the hetero semiconductor region 74; the first electrode 7, 27, or 37 corresponds to the source electrode 77; and the second electrode 8, 28, or 38 corresponds to the drain electrode 78.

Furthermore, in the first to fourth embodiments, in the case where the laminated hetero semiconductor region 6, 26, or 36 is made, the method of this embodiment can be employed. That is, a structure in which the polysilicon layer 80 or 81 and the amorphous silicon layer 82 are in contact with each other is formed, and the amorphous silicon layer 82 is then crystallized by solid-phase crystal growth in the amorphous silicon layer 82.

In the first to fifth the embodiments, a semiconductor device in which silicon carbide (SiC) is used as a semiconductor base material has been described as one example. However, the semiconductor base material may be other semiconductor material such as GaN, diamond, silicon, or SiGe as long as it is a material different from the material of the hetero semiconductor region.

Furthermore, in the first to fifth embodiments, a description has been given using 4H type as the polytype of silicon carbide. However, other polytype such as 6H or 3C may be used.

Moreover, as to a material for a semiconductor layer of the laminated hetero semiconductor region, any of single-crystal silicon, amorphous silicon, polysilicon, GaAs, Ge, SiGe, and the like may be used as long as it is a material which forms a heterojunction with a substrate material.

Furthermore, in the first to fifth embodiments, a description has been given using a diode (transistor in the fifth embodiment) having a so-called vertical structure in which the second electrode 8 (drain electrode 78 in the fifth embodiment) and the first electrode 7 (source electrode 77 in the fifth embodiment) are placed to face each other across the epitaxial region 2 (epitaxial layer 72 in the fifth embodiment) and in which current is allowed to flow in the vertical direction. However, for example, a diode (transistor in the fifth embodiment) having a so-called lateral structure in which the second electrode 8 (drain electrode 78 in the fifth embodiment) and the first electrode 7 (source electrode 77 in the fifth embodiment) are placed on the same one main surface and in which current is allowed to flow in a lateral direction may be employed.

Also, in the aforementioned embodiments, a description has been given of an example in which polysilicon is used as a material used for the lowest hetero semiconductor region 3 (polysilicon layer 80 in the fifth embodiment) and the uppermost hetero semiconductor region 4 (polysilicon layer 81 in the fifth embodiment). However, any material can be used as long as it is a material which forms a heterojunction with silicon carbide.

Moreover, as one example, a description has been given using N type silicon carbide as the epitaxial region 2 and P type polysilicon as the lowest hetero semiconductor region 3. However, any of combinations of N type silicon carbide and N type polysilicon, P type silicon carbide and P type polysilicon, and P type silicon carbide and N type polysilicon may be employed. That is, the first conductivity type may be any of N type and P type.

Furthermore, it is a matter of course that modifications may be made without departing from the scope of the present invention.

According to the aforementioned embodiments of the present invention, by constructing a semiconductor device having a laminated structure in which the hetero semiconductor region is formed by laminating a plurality of semiconductor layers in which crystal alignment is discontinuous at a boundary between at least two layers, it becomes possible to provide a semiconductor device which has improved leakage current characteristics during reverse operation and is manufactured by an easy method, and in which loss at the time of forward conduction can be reduced, and to provide a method of manufacturing the same.

Sixth Embodiment

Constitution of Semiconductor Device

As shown in FIG. 19, the semiconductor device of this embodiment includes a first semiconductor region 200 made of a substrate material in which an N− type drift region (N− SiC) 102 is formed on a substrate region (N+ SiC) 101 made of N+ silicon carbide of 4H polytype. It should be noted that as the substrate region 101, for example, a material can be used which has a resistivity of several to several tens of milliohm centimeters and a film thickness of several tens to several hundreds of micrometers. Furthermore, as the drift region 102, for example, a material can be used which has an N type impurity density of $10^{15}$ to $10^{18}$ cm$^{-3}$ and a film thickness of several to several tens of micrometers. In this embodiment, the impurity density of the drift region 102 is $10^{16}$ cm$^{-3}$, and the film thickness thereof is 10□m. Moreover, in this embodiment, a description will be given for the case where the first semiconductor region 200 is formed of the substrate material including the substrate region 101 and the drift region 102. However, the first semiconductor region 200 maybe formed only of the substrate region 101 regardless of the magnitude of the resistivity.

In the semiconductor device of this embodiment, an insulating region 103 such as an oxide film and a hetero semiconductor region 104 made of polysilicon having a band gap width smaller than that of silicon carbide are formed to be in contact with a main surface opposite from the bonded surface between the drift region 102 and the substrate region 101. That is, in this semiconductor device, a heterojunction diode (heterojunction 105) is formed at the junction between the drift region 102 and the hetero semiconductor region 104 due to the difference between the band gap widths of the silicon carbide and polysilicon, and an energy barrier exists at the junction interface. It should be noted that in this embodiment, a P type material having an impurity density of $10^{19}$ cm$^{-3}$ and a film thickness of 0.5 µm is used as the hetero semiconductor region 104.

In the semiconductor device of this embodiment, an interlayer insulating film 106 such as an oxide film and a first electrode 107 made of a metal material are formed to be in contact with the hetero semiconductor region 104. Furthermore, the hetero semiconductor region 104 and the first electrode 107 are connected to each other in a contact portion 108. Moreover, the semiconductor device includes a second electrode 109 made of a metal material in contact with the substrate region 101. Furthermore, the length of a path for current flowing between the heterojunction 105 and the contact portion 108 through the hetero semiconductor region 104 is longer than at least the film thickness of the hetero semiconductor region 104 because of the existence of the insulating region 103.

Operation of Semiconductor Device

Next, the operation of the semiconductor device for the case where the device operates as a vertical diode using the first and second electrodes 107 and 109 as an anode and a cathode, respectively, will be described with forward operation and reverse operation separately.

Forward Operation

First, the forward operation of the semiconductor device will be described.

In the case where the second electrode 109 is held at ground potential and a positive potential is applied to the first electrode 107, the heterojunction diode shows forward characteristics, and shows conduction characteristics similarly to a schottky barrier diode. That is, in this case, forward current flows according to a voltage drop determined by the sum of respective built-in potentials extending from the heterojunction 105 into the drift region 102 and the hetero semiconductor region 104. For example, in this embodiment, the sum of the respective built-in potentials extending from the heterojunction 105 into the drift region 102 and the hetero semiconductor region 104 is approximately 1.3 V, and forward current flows according to a voltage drop corresponding to this sum.

It should be noted that in the semiconductor device of this embodiment, since the distance from the contact portion 108 to the heterojunction 105 becomes long compared to that of a conventional semiconductor device, resistance in the hetero semiconductor region 104 becomes large. However, resistance in a drift region of a conventional semiconductor device is large enough to be almost unaffected in comparison with resistance in a hetero semiconductor region. That is, in the case where the impurity concentrations and the thicknesses of the drift region and the hetero semiconductor region of the conventional semiconductor device are made equal to those of the semiconductor device of this embodiment, the resistance in the drift region of the conventional semiconductor device is higher than the resistance in the hetero semiconductor region by two or more orders of magnitude due to the impurity concentrations and one or more orders of magnitude due to the thicknesses, i.e., three to four orders of magnitude in total. Thus, in the semiconductor device of this embodiment, the resistance in the hetero semiconductor region 104 hardly affects the on-resistance of the entire semiconductor device.

Reverse Operation

Next, the reverse operation of the semiconductor device will be described.

In the case where the first electrode 107 is held at ground potential and a positive potential is applied to the second electrode 109, the heterojunction diode shows reverse characteristics, and a cutoff state is established. It should be noted that in the semiconductor device of this embodiment, since the conductivity type of the hetero semiconductor region 104 is of P type in a main region portion of an active region, the semiconductor device of this embodiment operates like a PN junction diode in terms of cutoff characteristics. This is because in a constitution in which the conductivity type of the hetero semiconductor region 104 is of P type and in which the conductivity type of the drift region 102 is of N type, leakage current passing through the energy barrier of the heterojunction interface 105 can be greatly reduced to such an extent that leakage current characteristics due to carriers generated under a predetermined electric field such as seen in a PN junction diode become dominant. The reason will be described below.

Leakage current characteristics of a schottky barrier diode are almost uniquely determined by the height of a schottky barrier formed due to the difference between the electron affinity of a semiconductor material and the work function of schottky metal. However, since a heterojunction diode is constructed by joining different semiconductor materials together, leakage current characteristics thereof are determined mainly by the height of an energy barrier generated between the different semiconductor materials and the size of a source of majority carriers which become the origin of leakage current. Of these, the height of the energy barrier is almost determined by respective semiconductor materials of the drift region 102 made of silicon carbide and the hetero semiconductor region 104 made of silicon, and therefore has performance similar to that of a schottky barrier diode. Furthermore, the semiconductor device of this embodiment is significantly small compared to schottky barrier diodes and conventional semiconductor devices from the viewpoint of a source of majority carriers which become the origin of leakage current. This is because in the semiconductor device of this embodiment, since the hetero semiconductor region 104 is of P type, conduction electrons serving as majority carrier for the N type drift region 102 are less prone to be generated in the hetero semiconductor region 104, and a constitution is provided in which a source of conduction electrons is suppressed.

However, in conventional semiconductor devices, due to the existence of grain boundaries in a polysilicon region, conduction electrons which serve as majority carriers are supplied from a first electrode through the grain boundaries to a heterojunction, and leakage current during reverse operation occurs. Accordingly, there have been limitations in improving breakdown voltage. If electrons are supplied to the heterojunction, original reverse characteristics of a heterojunction diode including the P type hetero semiconductor region 104 and the N type drift region 102 cannot be obtained, and leakage current characteristics similar to those of a schottky barrier diode are shown. In particular, if a polysilicon layer is actually formed on a silicon carbide substrate by LPCVD, silicon crystals grow into columnar shapes. As a result, grain boundaries are formed to linearly connect the first electrode and the heterojunction, and electrons are easily supplied from the first electrode to the heterojunction. It should be noted that although a description is given for a polysilicon region here, there is a possibility that a similar phenomenon may occur due to the existence of crystal defects or a predetermined heat treatment process also in the case where single-crystal silicon or another material is used instead of polysilicon.

On the other hand, in the semiconductor device of this embodiment, the length of the path for current flowing between the heterojunction 105 and the contact portion 108 through the hetero semiconductor region 104 is longer than at least the film thickness of the hetero semiconductor region 104 because of the existence of the insulating region 103. Accordingly, even in the case where the hetero semiconductor region 104 is formed of polysilicon, grain boundaries which linearly connect the contact portion 108 and the heterojunction 105 are not formed, and the amount of electrons supplied from the first electrode 107 through grain boundaries to the heterojunction 105 can be limited. Thus, the semiconductor device of this embodiment makes it possible to reduce leakage current during reverse operation.

It should be noted that the length of the current path in the hetero semiconductor region 104 is preferably made longer than the effective diffusion length of electrons supplied from the first electrode 107 through grain boundaries. Such a constitution makes it possible to prevent electrons from being supplied to the heterojunction 105. Accordingly, it is possible to realize leakage current characteristics originally possessed by a heterojunction diode, which are different from those of a schottky barrier diode.

In this embodiment, polysilicon is used as a material for the hetero semiconductor region 104. However, also in the case where single-crystal silicon or another material is used instead of polysilicon, since electrons are supplied from the first electrode 107 due to the existence of crystal defects or a predetermined heat treatment process, the insulating region 103 can reduce the diffusion of electrons into the heterojunction 105 and reduce leakage current.

As shown in FIG. 20, the insulating region 103 may be formed inside the hetero semiconductor region 104 so that the insulating region 103 is not in contact with the drift region 102. Such a constitution makes it possible to make the effective area of the heterojunction 105 large. Accordingly, leakage current during reverse operation can be reduced, and on-resistance due to a junction during forward operation can be reduced.

Figure 21:
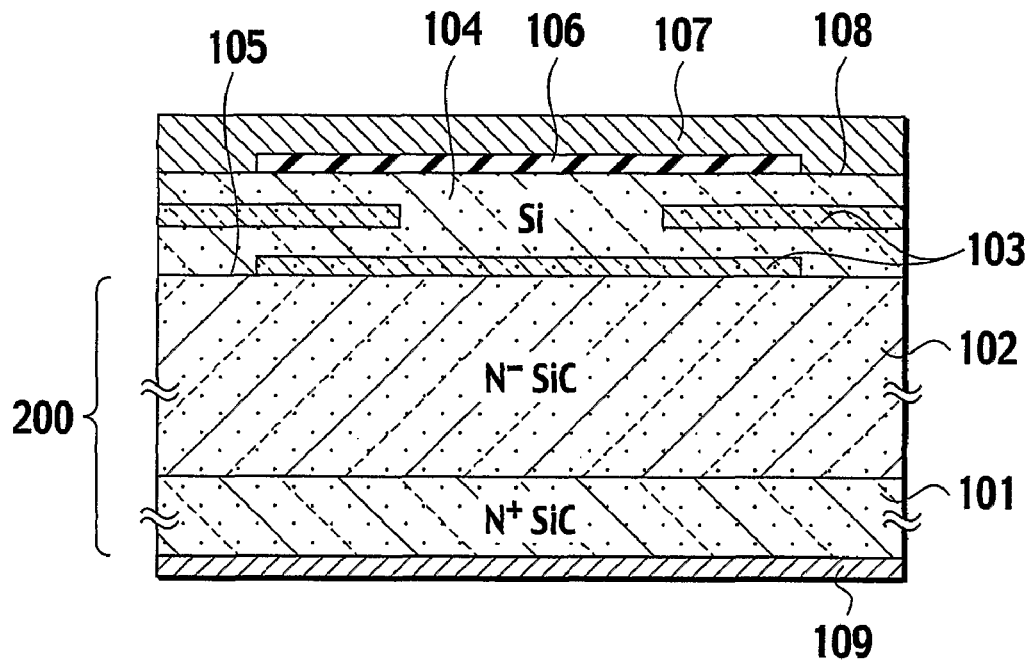
FIG. 21 is a cross-sectional view of a semiconductor device for explaining other forms of the sixth embodiment of the present invention.

As shown in FIG. 21, for example, by forming the insulating region 103 at each of positions adjacent and nonadjacent to the drift region 102 in the hetero semiconductor region 104, a plurality of insulating regions 103 may be formed in layers of the hetero semiconductor region 104, respectively. With such a constitution, the length of the path for current flowing between the heterojunction 105 and the contact portion 108 through the hetero semiconductor region 104 can be made longer in a limited region. Accordingly, heterojunction diodes can be formed at a higher density to improve integration degree.

Figure 22:
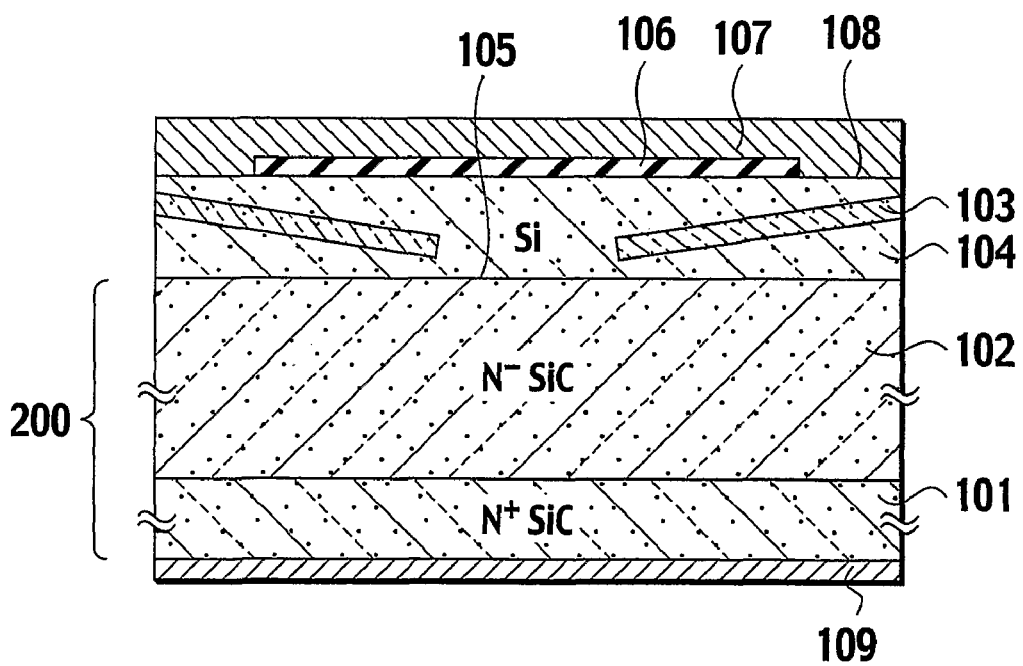
FIG. 22 is a cross-sectional view of a semiconductor device for explaining other forms of the sixth embodiment of the present invention.
Figure 23:
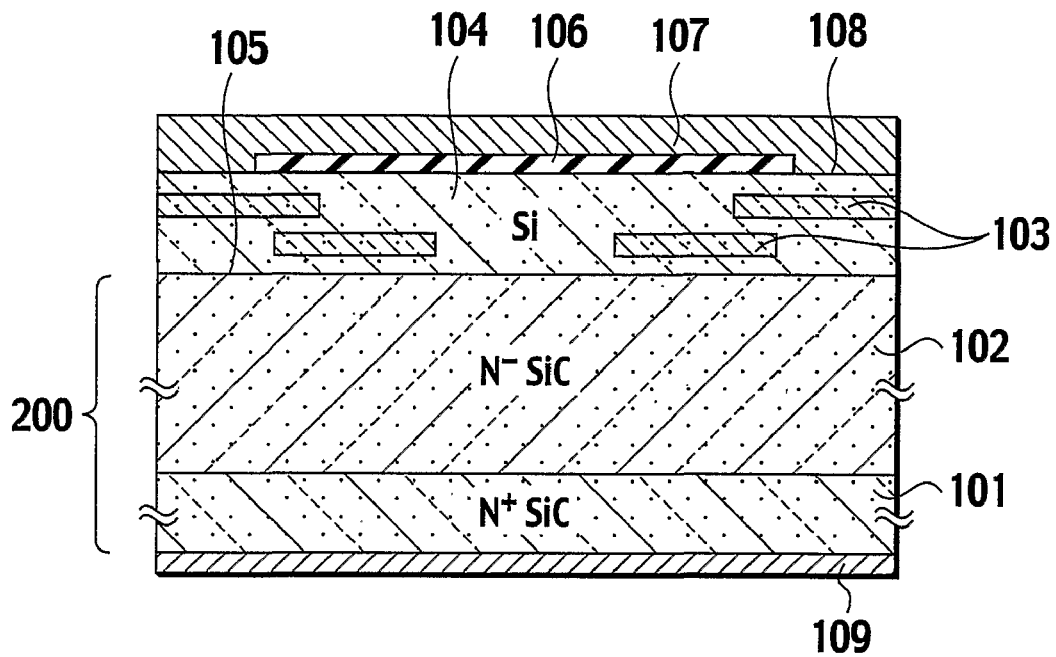
FIG. 23 is a cross-sectional view of a semiconductor device for explaining other forms of the sixth embodiment of the present invention.

As shown in FIG. 22, the insulating region 103 maybe obliquely formed so that the film thickness in the vicinity of the hetero semiconductor region 104 in contact with the contact portion 108 becomes small and that the film thickness in the vicinity of the hetero semiconductor region 104 in contact with the heterojunction 105 becomes large. With such a constitution, paths of grain boundaries through which electrons diffuse can be reduced in the vicinity of the hetero semiconductor region 104 supplied with electrons from the first electrode 107 while the increase of resistance in the current path in the hetero semiconductor region 104 is suppressed. That is, leakage current can be further reduced while a predetermined on-resistance is maintained. Moreover, in this case, variations in manufacture can be easily reduced by forming a plurality of insulating regions 103 in a layered manner as shown in FIG. 23.

Figure 24:
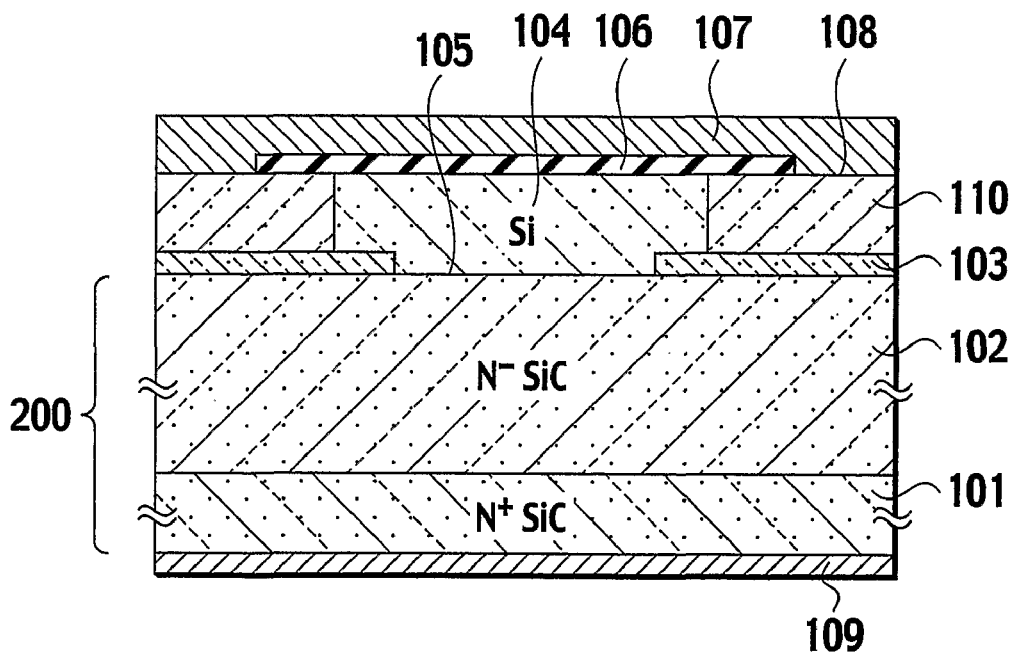
FIG. 24 is a cross-sectional view of a semiconductor device for explaining other forms of the sixth embodiment of the present invention.
Figure 25:
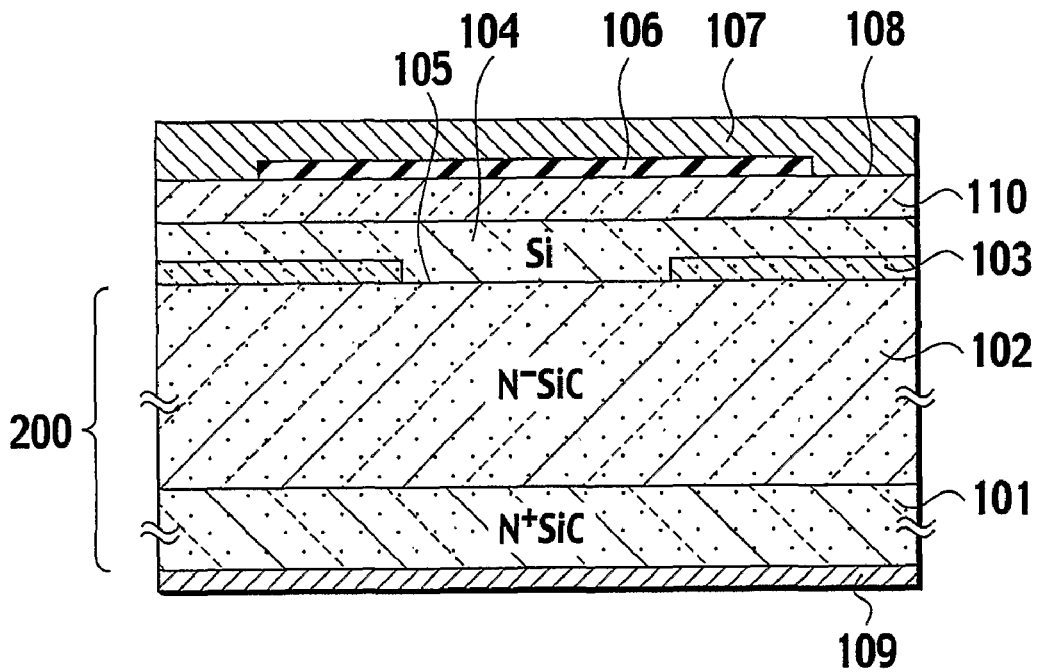
FIG. 25 is a cross-sectional view of a semiconductor device for explaining other forms of the sixth embodiment of the present invention.

Although the hetero semiconductor region 104 has a single conductivity type and a single impurity density in the semiconductor devices shown in FIGS. 19 to 23, a second hetero semiconductor region 110 having a conductivity type and an impurity density different from those of the hetero semiconductor region 104 may be provided as shown in FIGS. 24 and 25. In this case, the second hetero semiconductor region 110 may be of P type or N type, and the impurity density thereof may also be larger or smaller than that of the hetero semiconductor region 104.

Furthermore, although the semiconductor devices shown in FIGS. 19 to 25 have a simple constitution in which a heterojunction diode is formed, a voltage-withstanding structure may be formed in an outermost portion of the heterojunction diode. Specifically, an edge portion of the hetero semiconductor region 104 may be mounted on an interlayer insulating film made of $SiO_2$, or the drift region 102 may include a field limiting region, a guard ring, and a mesa structure obtained by trenching the drift region 102.

Seventh Embodiment

Figure 26:
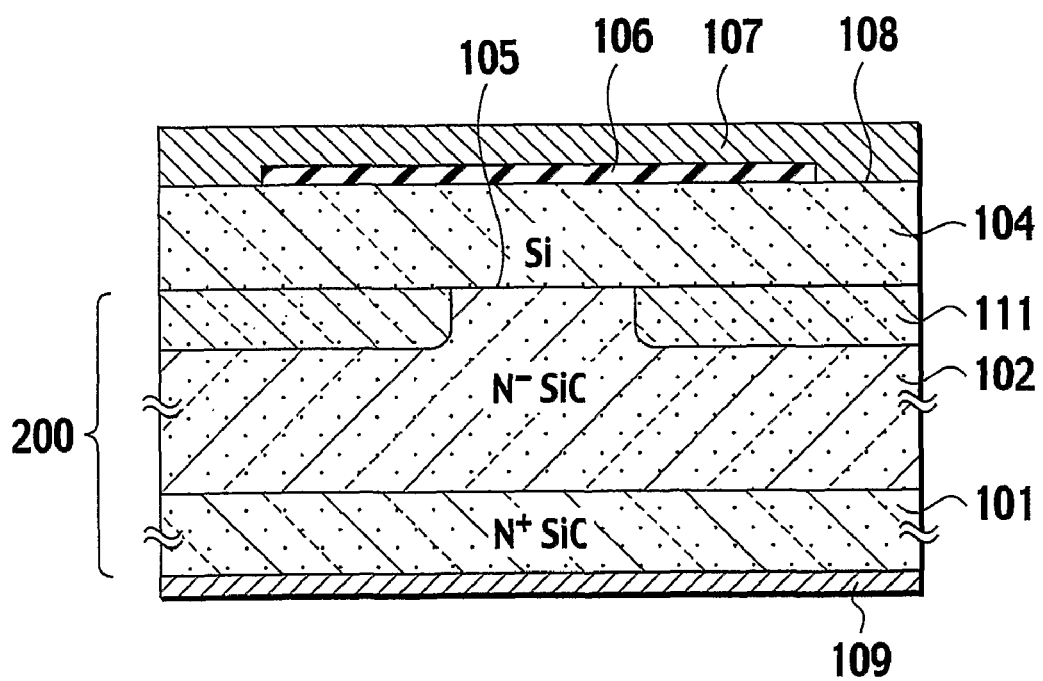
FIG. 26 is a cross-sectional view of a semiconductor device for explaining a seventh embodiment of the present invention.

Next, the constitution of a semiconductor device, which is a seventh embodiment of the present invention, will be described with reference to FIG. 26.

Constitution of Semiconductor Device

In the semiconductor device of this embodiment, instead of the insulating region 103 of the semiconductor device according to the sixth embodiment, P type well regions 111 are formed in the drift region 102.

Operation of Semiconductor Device

Next, the operation of the semiconductor device for the case where it operates as a vertical diode using the first and second electrodes 107 and 109 as an anode and a cathode, respectively; will be described with forward operation and reverse operation separately.

Forward Operation

First, the forward operation of the semiconductor device will be described.

In the case where the second electrode 109 is held at ground potential and a positive potential is applied to the first electrode 107, the heterojunction diode shows forward characteristics, and current flows with low on-resistance. The reason is as follows: in this case, PN junction diodes formed between the drift region 102 and the well regions 111 are also in forward-biased states; however, since the built-in potential is approximately 3 V, current does not flow between the drift region 102 and the well regions 111.

Reverse Operation

Next, the reverse operation of the semiconductor device will be described.

In the case where the first electrode 107 is held at ground potential and a positive potential is applied to the second electrode 109, the heterojunction diode shows reverse characteristics, and a cutoff state is established. The reason is as follows: the PN junction diodes formed between the drift region 102 and the well regions 111 are also in reverse-biased states, and leakage current is smaller than in the heterojunction between the hetero semiconductor region 104 and the drift region 102. Furthermore, when the positive potential of the second electrode 109 is increased, a depletion layer extends at the PN junctions between the drift region 102 and the well regions 111. When the drift region 102 sandwiched between the well regions 111 facing each other is fully depleted, an electric field at the heterojunction 105 is blocked, and the occurrence of leakage current can be further reduced.

Figure 27:
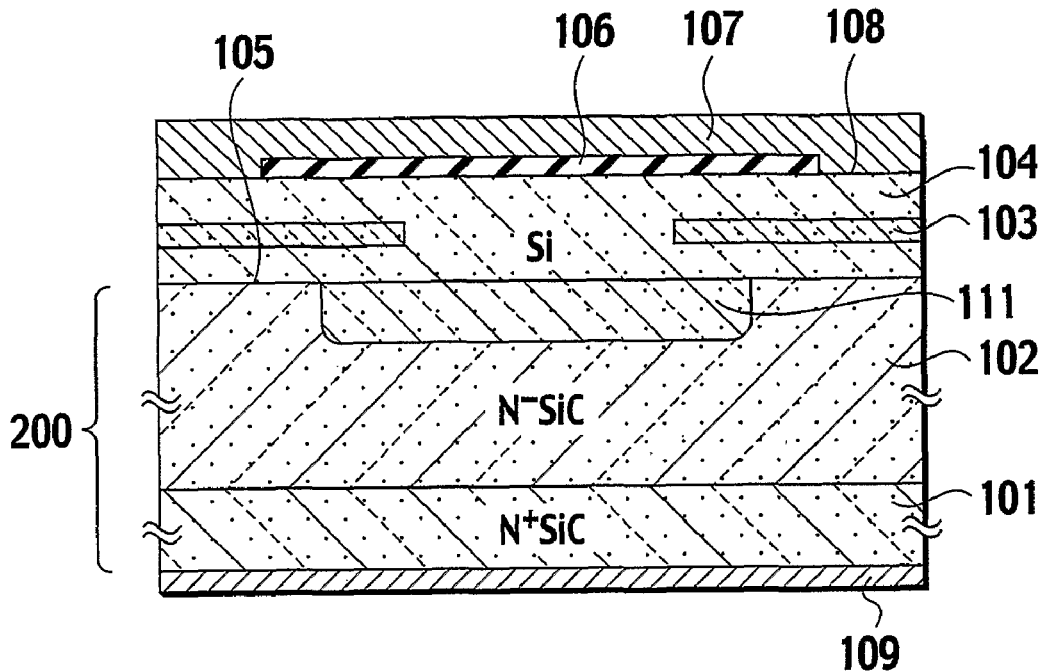
FIG. 27 is a cross-sectional view of a semiconductor device for explaining other forms of the seventh embodiment of the present invention.
Figure 28:
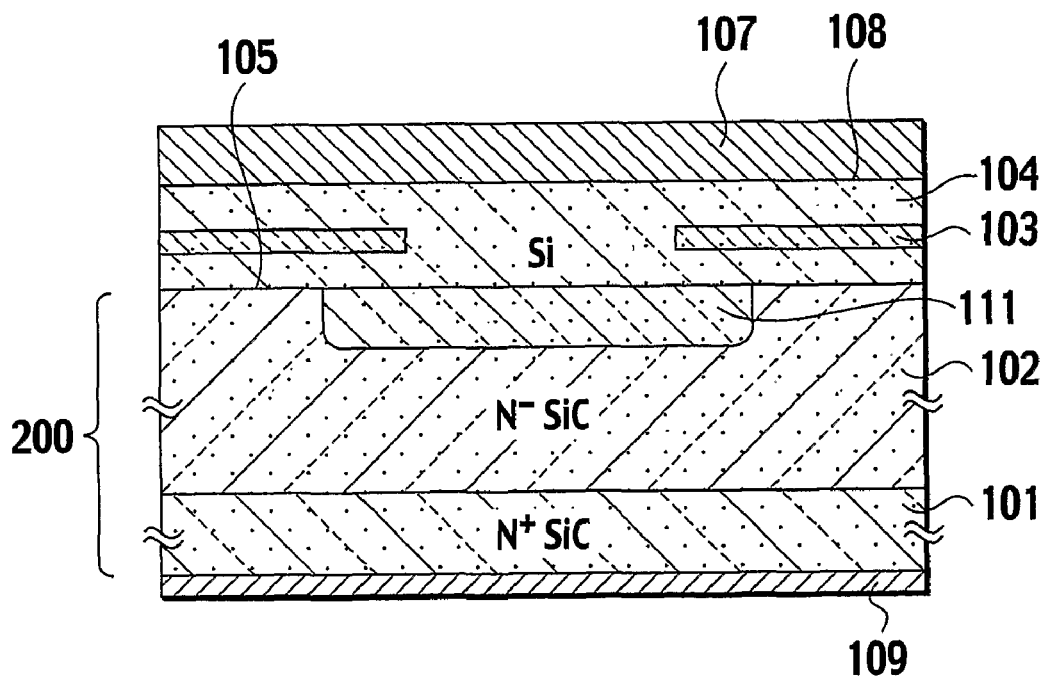
FIG. 28 is a cross-sectional view of a semiconductor device for explaining other forms of the seventh embodiment of the present invention.

It should be noted that although the well regions 111 are used as barrier regions in this embodiment, the insulating region 103 and the well regions 111 may be used in combination as shown in FIG. 27. In the case where the insulating region 103 and the well regions 111 are used in combination, technical effects of a semiconductor device according to the present invention can be obtained even if the interlayer insulating film 106 is not provided as shown in FIG. 28. In any case, it is acceptable that the provision of barrier regions makes the length of a path for current flowing between the heterojunction 105 and the contact portion 108 through the hetero semiconductor region 104 longer than at least the film thickness of the hetero semiconductor region 104. Furthermore, although this embodiment has been described on the assumption that the P type well regions 111 are activated semiconductors, high-resistance regions which are inactive semiconductors may be used, or electrically insulated regions may be used.

In the sixth and seventh embodiment of the present invention, the length of the path for current flowing between the heterojunction and the contact portion through the hetero semiconductor region is longer than at least the film thickness of the hetero semiconductor region. Accordingly, even in the case where the hetero semiconductor region is formed of polysilicon, grain boundaries linearly connecting the contact portion and the heterojunction are not formed, and the amount of electrons supplied from the first electrode through grain boundaries to the heterojunction can be limited. Thus, the semiconductor device according to the present invention makes it possible to reduce leakage current during reverse operation and improve cutoff characteristics.

The entire content of Patent Applications No. TOKUGAN 2005-263313 with a filing date of Sep. 12, 2005, No. TOKUGAN 2006-122197 with a filing date of Apr. 26, 2006, and No. TOKUGAN 2006-136144 with a filing date of May 16, 2006 in Japan are hereby incorporated by reference.

Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

The invention claimed is:

1. A semiconductor device, comprising:
    a semiconductor base of a first conductivity type;
    a hetero semiconductor region of a second conductivity type in contact with one main surface of the semiconductor base, the hetero semiconductor region having a band gap width different from that of the semiconductor base;
    a first electrode connected to the hetero semiconductor region; and
    a second electrode connected to the semiconductor base,
    wherein the hetero semiconductor region comprises structure for reducing leakage current generated during reverse operation,
    wherein the hetero semiconductor region is formed of a laminated hetero semiconductor region in which a plurality of semiconductor layers are superposed on one another, and
    wherein an uppermost semiconductor layer of the laminated hetero semiconductor region is connected to the first electrode, a lowest layer of the laminated hetero semiconductor region is in contact with the semiconductor base, and the uppermost semiconductor layer is in direct contact with the semiconductor base, and
    wherein the uppermost semiconductor layer has higher impurity concentration than the lowest layer.

2. The semiconductor device according to claim 1,
    wherein the second electrode forms an ohmic contact to the semiconductor base, and a boundary between at least two of the semiconductor layers has a portion in which crystal alignment is discontinuous.

3. The semiconductor device according to claim 1, further comprises:

a gate electrode adjacent to a junction between the hetero semiconductor region and the semiconductor base across a gate insulating film, wherein the second electrode forms an ohmic contact to the semiconductor base, and a boundary between at least two of the semiconductor layers has a portion in which crystal alignment is discontinuous.

4. The semiconductor device according to claim 2, wherein the laminated hetero semiconductor region has a portion in which impurity concentration is discontinuous.

5. The semiconductor device according to claim 2, wherein the uppermost semiconductor layer of the laminated hetero semiconductor region forms an ohmic contact to the first electrode.

6. The semiconductor device according to claim 2, wherein the semiconductor base is made of any one of silicon carbide, gallium nitride, and diamond.

7. The semiconductor device according to claim 2, wherein the semiconductor layers are made of any one of single-crystal silicon, amorphous silicon, polysilicon, gallium arsenic, germanium, and silicon germanium.

8. The semiconductor device according to claim 1, wherein the hetero semiconductor region comprises a barrier region for making a length of a path for current longer than at least a film thickness of the hetero semiconductor region, the current flowing between a heterojunction in which the semiconductor base and the hetero semiconductor region are in contact with each other and a contact portion in which the first electrode and the hetero semiconductor region are in contact with each other.

9. The semiconductor device according to claim 8, wherein the length of the current path is longer than at least an effective diffusion length of electrons supplied from the first electrode.

10. The semiconductor device according to claim 8, wherein at least a portion of a region functioning as the barrier region is made of an insulating film formed in contact with at least the hetero semiconductor region.

11. The semiconductor device according to claim 8, wherein the barrier region is placed to be separated from the heterojunction and the contact portion.

12. The semiconductor device according to claim 8, wherein at least a portion of a region functioning as the barrier region is made of a well region of a second conductivity type, the well region being formed in the semiconductor base.

13. The semiconductor device according to claim 8, wherein a conductivity type of at least a portion of the hetero semiconductor region is a second conductivity type.

14. The semiconductor device according to claim 8, wherein the semiconductor base is formed of any one of silicon carbide, gallium nitride, and diamond.

15. The semiconductor device according to claim 8, wherein the hetero semiconductor region is formed of any one of single-crystal silicon, polysilicon, amorphous silicon, germanium, and silicon germanium.

* * * * *